United States Patent
Weiss et al.

(10) Patent No.: US 10,494,277 B2
(45) Date of Patent: Dec. 3, 2019

(54) ACHIEVING WATER RELEASE ZONE FOR DEWATERING THICK FINE TAILINGS BASED ON SHEARING PARAMETER SUCH AS CAMP NUMBER

(71) Applicant: SUNCOR ENERGY INC., Calgary (CA)

(72) Inventors: Marvin Weiss, Calgary (CA); Ana Sanchez, Calgary (CA); Trevor Bugg, Fort McMurray (CA); Adrian Revington, Fort McMurray (CA)

(73) Assignee: Suncor Energy Inc., Calgary, Alberta (CA)

(*) Notice: Subject to any disclaimer, the term of this patent is extended or adjusted under 35 U.S.C. 154(b) by 1099 days.

(21) Appl. No.: 14/408,691

(22) PCT Filed: Jun. 21, 2013

(86) PCT No.: PCT/CA2013/050490
§ 371 (c)(1),
(2) Date: Dec. 17, 2014

(87) PCT Pub. No.: WO2013/188985
PCT Pub. Date: Dec. 27, 2013

(65) Prior Publication Data
US 2015/0299005 A1    Oct. 22, 2015

Related U.S. Application Data

(60) Provisional application No. 61/662,695, filed on Jun. 21, 2012.

(51) Int. Cl.
*B01D 21/01* (2006.01)
*C02F 1/52* (2006.01)
(Continued)

(52) U.S. Cl.
CPC .............. *C02F 1/52* (2013.01); *B01D 21/01* (2013.01); *B01D 21/286* (2013.01); *B01D 21/30* (2013.01);
(Continued)

(58) Field of Classification Search
CPC .. C02F 11/12; C02F 11/14; C02F 1/52; C02F 1/5209; C02F 1/5227; C02F 1/5263;
(Continued)

(56) References Cited

U.S. PATENT DOCUMENTS

2008/0190860 A1* 8/2008 Franks ................ B01D 21/01
                                                      210/724
2011/0131873 A1* 6/2011 Soane ...................... C02F 1/40
                                                      44/608

FOREIGN PATENT DOCUMENTS

CA         2701317       *  3/2011
CA         2806588 A1      7/2011
WO      WO2011032258      *  3/2011

OTHER PUBLICATIONS

McFarlane et al., Colloids and Surfaces A: Physicochem. Eng. Aspects 317 (2008) 39-48. (Year: 2008).*
(Continued)

*Primary Examiner* — Pranav N Patel
(74) *Attorney, Agent, or Firm* — BakerHostetler

(57) ABSTRACT

Various techniques are provided in relation to flocculation and/or dewatering of thick fine tailings, with shear conditioning of flocculated tailings material in accordance with a pre-determined shearing parameter, such as the Camp Number. One example method of treating thick fine tailings including dispersing a flocculant into the thick fine tailings to form a flocculating mixture; shearing the flocculating mixture to increase yield stress and produce a flocculated mixture; shear conditioning the flocculated mixture to decrease the yield stress and break down flocs, the shear
(Continued)

conditioning being performed in accordance with the predetermined shearing parameter to produce conditioned flocculated material within a water release zone where release water separates from the conditioned flocculated material. The conditioned flocculated material can then be subjected to dewatering, for example by depositing, thickening or filtering. The design, construction and/or operation of a flocculation pipeline assembly can be facilitated.

34 Claims, 9 Drawing Sheets

(51) Int. Cl.
    *B01D 21/28*    (2006.01)
    *B01D 21/30*    (2006.01)
    *G06F 17/50*    (2006.01)
    *C02F 103/10*   (2006.01)

(52) U.S. Cl.
    CPC ........ *C02F 1/5209* (2013.01); *G06F 17/5004* (2013.01); *C02F 2103/10* (2013.01)

(58) Field of Classification Search
    CPC ... C02F 2103/10; B01D 21/01; B01D 21/286; B01D 21/30; B09B 3/0033; C10G 1/045; C10G 2300/1033; C10G 2300/208
    See application file for complete search history.

(56) References Cited

OTHER PUBLICATIONS

International Search Report dated Sep. 6, 2013 from International Application No. PCT/CA2013/050490.

* cited by examiner

ACHIEVING WATER RELEASE ZONE FOR DEWATERING THICK FINE TAILINGS BASED ON SHEARING PARAMETER SUCH AS CAMP NUMBER

REFERENCE TO RELATED APPLICATIONS

This application is the U.S. national stage of International application No. PCT/CA2013/050490, filed Jun. 21, 2013, which claims the priority of Canadian application No. 61662695, filed Jun. 21, 2012, the disclosures of which are incorporated in their entireties herein.

BACKGROUND OF THE INVENTION

The present invention generally relates to the field of dewatering thick fine tailings.

BACKGROUND

Thick fine tailings derived from mining operations, such as oil sands mining, are often placed in dedicated disposal ponds for settling. The settling of fine solids from the water in tailings ponds is a relatively slow process. Certain techniques have been developed for dewatering thick fine tailings, such as oil sands mature fine tailings (MFT). Dewatering of thick fine tailings can include contacting the thick fine tailings with a flocculant and then depositing the flocculated fine tailings in a deposition area where the deposited material can release water and eventually dry.

There are various challenges related to flocculating thick fine tailings with the view of dewatering the flocculated material.

SUMMARY OF THE INVENTION

Various techniques are described herein for enhanced operations with respect to various aspects of flocculation and/or dewatering of thick fine tailings.

In some implementations, there is provided a method of treating thick fine tailings, comprising:
  flocculating the thick fine tailings comprising the following flocculation stages:
    a dispersion stage comprising dispersing a flocculant into the thick fine tailings to form a flocculation tailings material;
    a floc build-up stage comprising shearing the flocculation tailings material and increasing the yield stress of the flocculation tailings material; and
    a floc breakdown stage comprising shearing the flocculation tailings material under a laminar flow regime and decreasing the yield stress of the flocculation tailings material decreases, wherein the floc breakdown stage comprises:
      imparting a pre-determined amount of shear conditioning to the flocculation tailings material in accordance with a Camp Number sufficient that the flocculation tailings material attains a water release zone wherein release water separates from the flocculation tailings material; and
  depositing the flocculation tailings material that is within the water release zone onto a sub-aerial deposition area.

In some implementations, the pre-determined amount of shear conditioning is provided by a pipeline assembly.

In some implementations, the pipeline assembly has a configuration determined by Camp Number scaling from laboratory scale mixer tests.

In some implementations, the Camp Number scaling comprises: determining rheological behaviour of a sample flocculation mixture comprising a sample of the thick fine tailings and the flocculant in the laboratory scale mixer; determining a laboratory scale Camp Number sufficient to bring the sample flocculation mixture within a water release zone in the laboratory scale mixer; determining the Camp Number so as to be substantially similar to the laboratory scale Camp Number; and determining an equivalent pipe length for the pipeline assembly based on the Camp Number.

In some implementations, the Camp Number is within about 10% of the laboratory scale Camp Number. In some implementations, the laboratory scale mixer comprises a paddle mixer.

In some implementations, the step of determining rheological behaviour of the sample flocculation mixture, comprises: determining an optimal flocculant dose range for addition to the sample of the thick fine tailings; adding the flocculant into the sample of the thick fine tailings within the optimal flocculant dose range, to form a sample flocculating mixture; imparting dispersive mixing to the sample flocculating mixture in order to promote dispersion of the flocculant and floc build up, to form a flocculated material; and imparting lower mixing to the flocculated material in order to commence floc breakdown until reaching the water release zone; and determining a yield stress response over time of the flocculating mixture and the flocculated material.

In some implementations, the step of determining the Camp Number comprises using a Herschel-Bulkley Model.

In some implementations, the pipeline assembly comprises at least one bifurcation into branch lines. In some implementations, the pipeline assembly comprises an in-line mixer having an equivalent pipe length value. In some implementations, the pipeline assembly consists essentially of a pipeline.

In some implementations, the process also includes:
  modifying the step of flocculating the thick fine tailings by changing:
    properties of the thick fine tailings,
    type of flocculant; and/or
    dosage of the flocculant with respect to the thick fine tailings;
  determining a new Camp Number and a new pre-determined amount of shear conditioning for the floc breakdown stage; and
  imparting the new pre-determined amount of shear conditioning to the flocculation tailings material sufficient that the flocculation tailings material is within the water release zone.

In some implementations, the step of imparting the new pre-determined amount of shear conditioning comprises re-configuring the pipeline assembly to increase or decrease the equivalent pipe length.

In some implementations, the pipeline assembly comprises a plurality of lines for transporting and depositing the flocculation tailings material onto respective deposition areas, the lines being configured to have substantially the same lengths and diameters.

In some implementations, the pipeline assembly comprises a plurality of lines for transporting and depositing the flocculation tailings material onto respective deposition areas, each of the lines being configured to have different lengths and/or different diameters, and being selected to receive a corresponding flow of the flocculation tailings material in accordance with a corresponding pre-determined amount of shear conditioning.

In some implementations, the Camp Number and the pre-determined amount of shear conditioning are provided so as to achieve a water release peak range within the water release zone.

In some implementations, the thick fine tailings comprise mature fine tailings. In some implementations, the mature fine tailings are derived from oil sands. In some implementations, the thick fine tailings are retrieved from a tailings pond or from a separation unit of an extraction operation.

In some implementations, there is provided a method of treating thick fine tailings, comprising:
  dispersing a flocculant into the thick fine tailings to produce a flocculation tailings material;
  pipeline conditioning the flocculation tailings material to impart:
    sufficient shear to build up flocs and reach a peak yield stress of the flocculation tailings material; and
    a pre-determined amount of shear conditioning to the flocculation tailings material in accordance with a Camp Number sufficient that the flocculation tailings material having a laminar flow regime decreases in yield stress from the peak yield stress and reaches a water release zone wherein release water separates from the flocculation tailings material; and
  depositing the flocculation tailings material that is within the water release zone onto a sub-aerial deposition area.

In some implementations, there is provided a method of configuring a pipeline assembly for transporting and conditioning a flocculated thick fine tailings material, comprising:
  determining under laminar conditions a laboratory scale Camp Number for a sample of flocculated thick fine tailings sufficient to achieve floc breakdown and water release; and
  providing the pipeline assembly with a configuration so as to provide a substantially similar Camp Number as the laboratory scale mixer Camp Number with respect to the flocculated thick fine tailings material having a laminar flow regime through the pipeline assembly.

In some implementations, there is provided a method of treating thick fine tailings, comprising:
  dispersing a flocculant into the thick fine tailings to form a flocculating mixture;
  shearing the flocculating mixture to increase a yield stress of the flocculating mixture and build up flocs, thereby producing a flocculated mixture;
  shear conditioning the flocculated mixture to decrease the yield stress of the flocculated mixture and break down flocs, wherein the shear conditioning is performed in accordance with a pre-determined shearing parameter sufficient to produce a conditioned flocculated material that is within a water release zone wherein release water separates from the conditioned flocculated material; and
  dewatering the conditioned flocculated material while within the water release zone.

In some implementations, the step of dewatering comprises depositing the conditioned flocculated material onto a sub-aerial deposition area.

In some implementations, the step of dewatering comprises supplying the conditioned flocculated material into a separation apparatus to separate the release water from a water-reduced tailings material.

In some implementations, there is also the step of empirically deriving the pre-determined shearing parameter.

In some implementations, the pre-determined shearing parameter comprises or consists of shear rate and residence time variables.

In some implementations, the pre-determined shearing parameter comprises a dimensionless number.

In some implementations, the step of empirically deriving the pre-determined shearing parameter comprises laboratory experimentation.

In some implementations, the step of empirically deriving the pre-determined shearing parameter comprises: determining rheological behaviour of a sample flocculation mixture comprising a sample of the thick fine tailings and the flocculant in a laboratory scale mixer, wherein the sample flocculation mixture increases in yield stress to form a sample flocculated mixture and then decreases in yield stress under shearing conditions; determining a laboratory scale shearing parameter sufficient to bring the sample flocculated mixture within a water release zone in the laboratory scale mixer; and determining the pre-determined shearing parameter so as to be substantially similar to the laboratory scale shearing parameter.

In some implementations, there is also the step of determining an equivalent pipe length and diameter for a pipeline assembly based on the pre-determined shearing parameter in order to provide the shear conditioning.

In some implementations, the laboratory scale mixer comprises a paddle mixer.

In some implementations, the step of determining rheological behaviour of the sample flocculation mixture, comprises: determining an optimal flocculant dose range for addition to the sample of the thick fine tailings; adding the flocculant into the sample of the thick fine tailings sample at the optimal flocculant dose range, to form a sample flocculating mixture; imparting dispersive mixing to the sample flocculating mixture in order to promote dispersion of the flocculant and floc build up, to form the sample flocculated mixture; imparting lower mixing to the sample flocculated mixture in order to commence floc breakdown until reaching the water release zone; and determining a yield stress response over time of the flocculating mixture and the flocculated material.

In some implementations, the pre-determined shearing parameter comprises a Camp Number. In some implementations, the pre-determined shearing parameter consists of a Camp Number.

In some implementations, the shear conditioning the flocculated mixture is performed under laminar flow conditions.

In some implementations, the shear conditioning is provided by a pipeline assembly.

In some implementations, the pipeline assembly is provided with a length and a diameter sufficient to impart the shear conditioning to the flocculated mixture in accordance with the pre-determined shearing parameter.

In some implementations, there is provided a treatment system for treating thick fine tailings, comprising:
  a dispersion and floc build-up assembly for dispersing a flocculant into the thick fine tailings to form a flocculating mixture and subjecting the flocculating mixture to shear to increase a yield stress of the flocculating mixture and build up flocs, thereby producing a flocculated mixture;
  a pipeline conditioning assembly sized and configured for subjecting the flocculated mixture to an amount of shear conditioning in accordance with a pre-determined shearing parameter sufficient to decrease the yield stress of the flocculated mixture and produce a conditioned flocculated material that is within a water release zone wherein release water separates from the conditioned flocculated material; and a dewatering unit for receiving the conditioned flocculated material while within the water release zone, for producing release water and dewatered tailings material.

In some implementations, the pipeline conditioning assembly is sized and configured such that the flocculated mixture has a laminar flow regime and the pre-determined shearing parameter is a pre-determined Camp Number.

In some implementations, the pipeline conditioning assembly is sized to have a pipe length and diameter for providing the pre-determined Camp Number.

In some implementations, the system also includes a test kit for determining the pre-determined Camp Number.

In some implementations, the test kit comprises: a vessel for receiving a sample mixture comprising a sample of the thick fine tailings and the flocculant; a mixing element for mixing the sample mixture within the vessel; a yield stress measurement device for measuring yield stress of the sample mixture during the mixing; a timer for measuring the time during the mixing; a shear rate measurement device for measuring the shear rate of the mixing; and water release detector for determining when the sample mixture achieves the water release zone where water separates from the sample mixture.

In some implementations, the test kit further comprises a recording device for recording the yield stress and the time of the sample mixture for determining yield stress versus time relationship.

In some implementations, the dispersion and floc build-up assembly comprises a mixer for dispersing the flocculant into the thick fine tailings to form the flocculating mixture; and a shearing assembly for subjecting the flocculating mixture to shear to produce the flocculated mixture. In some implementations, the mixer comprises an in-line co-annular mixer.

In some implementations, the first shearing assembly comprises a pipe section in fluid communication with the mixer for providing shear in the form of pipe flow shearing.

In some implementations, the pipeline conditioning assembly consists essentially of piping and has a pipe length and diameter sufficient to provide the amount of shear conditioning in accordance with the pre-determined shearing parameter.

In some implementations, the pipeline conditioning assembly comprises an in-line shear unit having an equivalent pipe length, such that the pipeline conditioning assembly has a total equivalent pipe length sufficient to provide the amount of shear conditioning in accordance with the pre-determined shearing parameter.

In some implementations, there is provided a method of designing a pipeline assembly for transporting and conditioning a flow of flocculated thick fine tailings material to a dewatering unit, comprising:
shearing a sample of flocculated thick fine tailings material and determining a sample shearing parameter comprising residence time and shear rate sufficient to bring the sample within a water release zone where release water separates from the sample; and
configuring the pipeline assembly so as to have a pipe length and diameter providing a pipeline shearing parameter that is substantially similar to the sample shearing parameter.

In some implementations, the shearing of the sample of flocculated thick fine tailings material is performed under laminar conditions and the flow of the flocculated thick fine tailings material has a laminar flow regime.

In some implementations, the sample shearing parameter comprises a sample Camp Number and the pipeline shearing parameter comprises a pipeline Camp Number.

In some implementations, the shearing of the sample of flocculated thick fine tailings material is performed in a laboratory scale mixer. In some implementations, the laboratory scale mixer comprises a paddle mixer.

In some implementations, the method also includes: adding a flocculant to a sample of thick fine tailings to produce a sample flocculating mixture; and subjecting the sample flocculating mixture to shear so as to build up flocs and increase yield stress to a peak yield stress level to produce the sample of flocculated thick fine tailings material.

In some implementations, the configuring of the pipeline assembly comprises providing at least one bifurcation into branch lines. In some implementations, the configuring of the pipeline assembly comprises providing an in-line mixer having an equivalent pipe length value.

In some implementations, the method also includes shearing multiple samples of the flocculated thick fine tailings material and determining multiple corresponding sample shearing parameters sufficient to bring the sample within a water release zone where release water separates from the sample; and configuring the pipeline assembly to provide multiple line sections having different lengths and/or diameters for imparting corresponding pipeline shearing parameters that are substantially similar to the respective sample shearing parameters.

In some implementations, the thick fine tailings and the sample comprise mature fine tailings. In some implementations, the mature fine tailings and the sample are derived from oil sands. In some implementations, the thick fine tailings and the sample are retrieved from a tailings pond or from a separation unit of an extraction operation.

In some implementations, there is provided a method of dewatering thick fine tailings, comprising:
flocculating the thick fine tailings to produce a flocculated thick fine tailings material;
shear conditioning the flocculated thick fine tailings material in a pipeline assembly having a pipe length and diameter sized and configured according to a pipeline shearing parameter that is substantially similar to a pre-determined sample shearing parameter comprising residence time and shear rate sufficient to bring a sample of the flocculated thick fine tailings material within a water release zone where release water separates from the sample, the pipeline assembly producing a conditioned flocculated material within the water release zone; and
dewatering the conditioned flocculated material while within the water release zone.

In some implementations, the flocculating step is performed in-line and comprises dispersing a flocculant into the thick fine tailings to form a flocculating mixture and shearing the flocculating mixture to build up flocs and produce the flocculated thick fine tailings material.

In some implementations, the pre-determined sample shearing parameter is determined by mixing a flocculant with a sample thick fine tailings to producing a sample flocculating mixture under turbulent conditions to form the sample of the flocculated thick fine tailings material having a peak yield stress, and then shearing the sample of the flocculated thick fine tailings material under laminar conditions until the water release zone.

In some implementations, the pre-determined sample shearing parameter is a sample Camp Number.

In some implementations, the pre-determined sample shearing parameter is determined by mixing a flocculant with a sample thick fine tailings to producing a sample flocculating mixture under turbulent conditions to form the sample of the flocculated thick fine tailings material having a peak yield stress, and then shearing the sample of the flocculated thick fine tailings material under laminar conditions until the water release zone.

In some implementations, the laboratory scale mixer comprises a paddle mixer.

In some implementations, there is provided a method of dewatering thick fine tailings, comprising:
flocculating the thick fine tailings to produce a flocculated thick fine tailings material;
shear conditioning the flocculated thick fine tailings material in a pipeline assembly having a pipe length and diameter sized substantially independent of flow rate of the flocculated thick fine tailings material and according to a pre-determined pipeline shearing parameter determined under laminar conditions and comprising residence time and shear rate, the pipeline assembly producing a conditioned flocculated material within the water release zone;
flowing the flocculated thick fine tailings material in the pipeline assembly to have a laminar flow regime; and
dewatering the conditioned flocculated material while within the water release zone.

In some implementations, the flocculating step is performed in-line and comprises dispersing a flocculant into the thick fine tailings to form a flocculating mixture and shearing the flocculating mixture to build up flocs and produce the flocculated thick fine tailings material.

In some implementations, the pre-determined sample shearing parameter is a sample Camp Number.

In some implementations, the pre-determined sample shearing parameter is determined by mixing a flocculant with a sample thick fine tailings to producing a sample flocculating mixture under turbulent conditions to form the sample of the flocculated thick fine tailings material having a peak yield stress, and then shearing the sample of the flocculated thick fine tailings material under laminar conditions until the water release zone.

In some implementations, the laboratory scale mixer comprises a paddle mixer.

In some implementations, the pipeline assembly consists essentially of a pipe.

In some implementations, there is provided a method of dewatering thick fine tailings, comprising:
adding a flocculant into the thick fine tailings to produce a flocculation tailings material;
shear conditioning the flocculation tailings material in a pipeline assembly to produce a conditioned flocculated material within a water release zone wherein release water separates from the conditioned flocculated material;
providing sufficient mixing of the flocculant and the thick fine tailings prior to the shear conditioning, so as to enable the pipeline assembly to have a pipe length based on Camp Number scaling to achieve the water release zone; and
dewatering the conditioned flocculated material within the water release zone.

In some implementations, the step of adding the flocculant is performed in-line.

In some implementations, the step of providing sufficient mixing is performed in-line.

In some implementations, the step of providing sufficient mixing is performed to increase a yield stress of the flocculation tailings material to a peak yield stress level.

In some implementations, the step of adding the flocculant is performed under turbulent flow conditions.

In some implementations, the step of providing sufficient mixing comprises subjecting the flocculation tailings material to turbulent flow conditions to build up flocs until reaching laminar flow conditions prior to the shear conditioning.

In some implementations, the Camp Number scaling comprises: mixing a sample of the thick fine tailings with the flocculant under turbulent conditions to produce a sample flocculated mixture; shearing the sample flocculated mixture under laminar conditions to determine a Camp Number for achieving the water release zone in the sample; and providing the pipeline assembly with a length and a diameter for providing the flocculating tailings material with an amount of shear according to the Camp Number.

In some implementations, the mixing a sample of the thick fine tailings with the flocculant is performed in a laboratory scale mixer.

In some implementations, the shearing of the sample flocculated mixture is performed in the laboratory scale mixer.

In some implementations, the laboratory scale mixer comprises a paddle mixer.

In some implementations, the pipeline assembly comprises at least one in-line shear device having an equivalent pipe length.

In some implementations, the pipeline assembly consists essentially of a pipe.

In some implementations, there is provided a treatment system for treating thick fine tailings, comprising:
an in-line injector for injecting a flocculant into a turbulent flow of the thick fine tailings to form a flocculating mixture;
a floc build-up pipeline assembly in fluid communication with the in-line injector for receiving the flocculating mixture and subjecting the flocculating mixture to shear to increase a yield stress of the flocculating mixture and build up flocs, thereby producing a flocculated mixture;
a floc breakdown pipeline assembly in fluid communication with the floc build-up pipeline assembly for receiving the flocculated mixture, the floc breakdown pipeline assembly being sized and configured for subjecting the flocculated mixture to an amount of shear conditioning under laminar conditions in accordance with a pre-determined shearing parameter sufficient to decrease the yield stress of the flocculated mixture and produce a conditioned flocculated material that is within a water release zone wherein release water separates from the conditioned flocculated material, the pre-determined shear parameter comprising residence time and shear rate in laminar conditions; and
a dewatering unit for receiving the conditioned flocculated material while within the water release zone, for producing release water and dewatered tailings material.

In some implementations, the pre-determined shearing parameter is a pre-determined Camp Number.

In some implementations, the floc breakdown pipeline assembly is sized to have a pipe length and diameter for providing the pre-determined Camp Number.

In some implementations, the floc breakdown pipeline assembly consists essentially of piping and has a pipe length and diameter sufficient to provide the amount of shear conditioning in accordance with the pre-determined shearing parameter.

In some implementations, the floc breakdown pipeline assembly comprises an in-line shear unit having an equivalent pipe length, such that the pipeline conditioning assembly has a total equivalent pipe length sufficient to provide the amount of shear conditioning in accordance with the pre-determined shearing parameter. In some implementations, the in-line shear unit comprises a static mixer.

In some implementations, the pre-determined shearing parameter is variable and the system further comprises an additional pipe section removably mountable to an outlet end of the floc breakdown pipeline assembly in order to vary the amount of shear conditioning under laminar conditions imparted to the flocculated tailings material in accordance with the pre-determined shearing parameter.

In some implementations, the floc breakdown pipeline assembly comprises: a first pipeline having a first diameter and a first length sufficient for providing the amount of shear conditioning, and configured to supply the conditioned flocculated material to a first dewatering unit; and a second pipeline having a second diameter smaller than the first diameter and a second length smaller than the first length providing the amount of shear conditioning, and configured to supply the conditioned flocculated material to a second dewatering unit located closer than the first.

In some implementations, the thick fine tailings comprise mature fine tailings. In some implementations, the mature fine tailings are derived from oil sands. In some implementations, the thick fine tailings are retrieved from a tailings pond or from a separation unit of an extraction operation.

It should also be noted that various features and implementations described above may be combined with one or more other features or implementations described above or herein.

DETAILED DESCRIPTION

Figure 1:
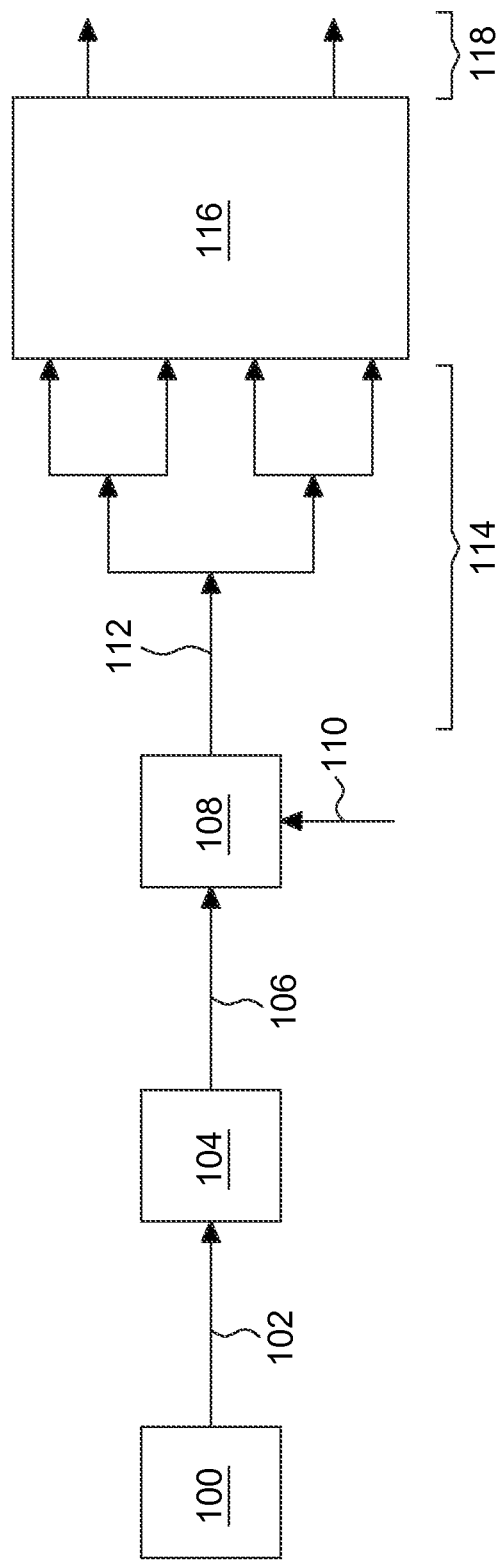
FIG. 1 is a block diagram of a dewatering operation.

Dewatering operations for treating thick fine tailings may include flocculation of the thick fine tailings followed by pipeline conditioning and deposition of the flocculated material onto a sub-aerial deposition site where the deposited material can dewater and dry. Various techniques are described herein for dewatering thick fine tailings by providing shear conditioning based on a pre-determined shearing parameter, such as a Camp Number that may be empirically derived from laboratory mixer tests, to impart sufficient shear so that the flocculated thick fine tailings material is within a water release zone where release water separates from the material. A pipeline assembly for transporting and conditioning the flocculated thick fine tailings material may be sized and configured in accordance with the pre-determined shear parameter, for facilitated design, construction and operation of dewatering facilities.

"Thick fine tailings" may be considered as suspensions derived from a mining operation and mainly include water and fines. The fines are small solid particulates having various sizes up to about 44 microns. The thick fine tailings have a solids content with a fines portion sufficiently high such that the fines tend to remain in suspension in the water and the material has slow consolidation rates. More particularly, the thick fine tailings may have a ratio of coarse particles to the fines that is less than or equal to 1. The thick fine tailings has a fines content sufficiently high such that flocculation of the fines and conditioning of the flocculated material can achieve a two phase material where release water can flow through and away from the flocs. For example, thick fine tailings may have a solids content between 10 wt % and 45 wt %, and a fines content of at least 50 wt % on a total solids basis, giving the material a relatively low sand or coarse solids content. The thick fine tailings may be retrieved from a tailings pond, for example, and may include what is commonly referred to as "mature fine tailings" (MFT).

"MFT" refers to a tailings fluid that typically forms as a layer in a tailings pond and contains water and an elevated content of fine solids that display relatively slow settling rates. For example, when whole tailings (which include coarse solid material, fine solids, and water) or thin fine tailings (which include a relatively low content of fine solids and a high water content) are supplied to a tailings pond, the tailings separate by gravity into different layers over time. The bottom layer is predominantly coarse material, such as sand, and the top layer is predominantly water. The middle layer is relatively sand depleted, but still has a fair amount of fine solids suspended in the aqueous phase. This middle layer is often referred to as MFT. MFT can be formed from various different types of mine tailings that are derived from the processing of different types of mined ore. While the formation of MFT typically takes a fair amount of time (e.g., between 1 and 3 years under gravity settling conditions in the pond) when derived from certain whole tailings supplied form an extraction operation, it should be noted that MFT and MFT-like materials may be formed more rapidly depending on the composition and post-extraction processing of the tailings, which may include thickening or other separation steps that may remove a certain amount of coarse solids and/or water prior to supplying the processed tailings to the tailings pond.

In some implementations, the thick fine tailings are MFT derived from a mining operation, for example, an oil sands mining operation. For illustrative purposes, some implementations described below may be described in the context of MFT or oil sands MFT, but it should be understood that other implementations can be used for thick fine tailings derived from other sources.

General Dewatering Operations

Before describing various techniques related to the flocculation and conditioning of the dewatering operation, an example of an overall dewatering operation will be described in general terms with reference to FIG. 1.

Referring to FIG. 1, in some implementations, the dewatering operation may include providing thick fine tailings from a tailings source 100, which may be a tailings pond for example, from which a flow of tailings 102 is retrieved by dredge or another type of pumping arrangement. The tailings 102 may then be subjected to pre-treatments, such as screening and/or pre-shearing in one or more pre-treatment units 104, for producing a pre-treated tailings flow 106 that is then supplied to a chemical addition unit 108 for contacting and mixing with a dewatering chemical 110, such as a flocculant. Once the thick fine tailings are mixed with the flocculant 110, a flocculation tailings material 112 may be pipelined through a transportation and conditioning assembly 114 and then discharged onto a deposition site 116 for water release and drying. In some implementations, the transportation and conditioning assembly may be in the form of a pipeline having certain dimensions and configuration. The transportation and conditioning assembly may include multiple piping sections as well as one or more in-line shear devices. The "flocculation tailings material" 112 may be considered as a mixture of flocculant and thick fine tailings that is in a state of flocculating or has been substantially flocculated and may be experiencing floc breakdown, as will be explained in further detail below. The transportation and conditioning assembly 114 may include an upstream floc build-up assembly that handles the material while in a state of flocculating and building up flocs, and a downstream floc breakdown assembly that handles the flocculated material while the flocs are being partially broken down. The transportation and conditioning assembly 114 may consist essentially of a pipeline such that the floc build-up and floc breakdown assemblies are part of the same overall pipeline. Once deposited, the release water may flow away from the flocculated solid matrix and be recovered by a water recovery assembly 118 for recycling into mining operations, extraction operations, water treatment facilities or other operations requiring process water.

The transportation and conditioning assembly 114 is configured for transporting and conditioning the flocculation tailings material 112 from the chemical addition unit 108 to the deposition site 116. In particular, the floc breakdown assembly may be configured and operated in accordance with a pre-determined shear parameter, such as the Camp Number, which will be described further below.

Figure 9:
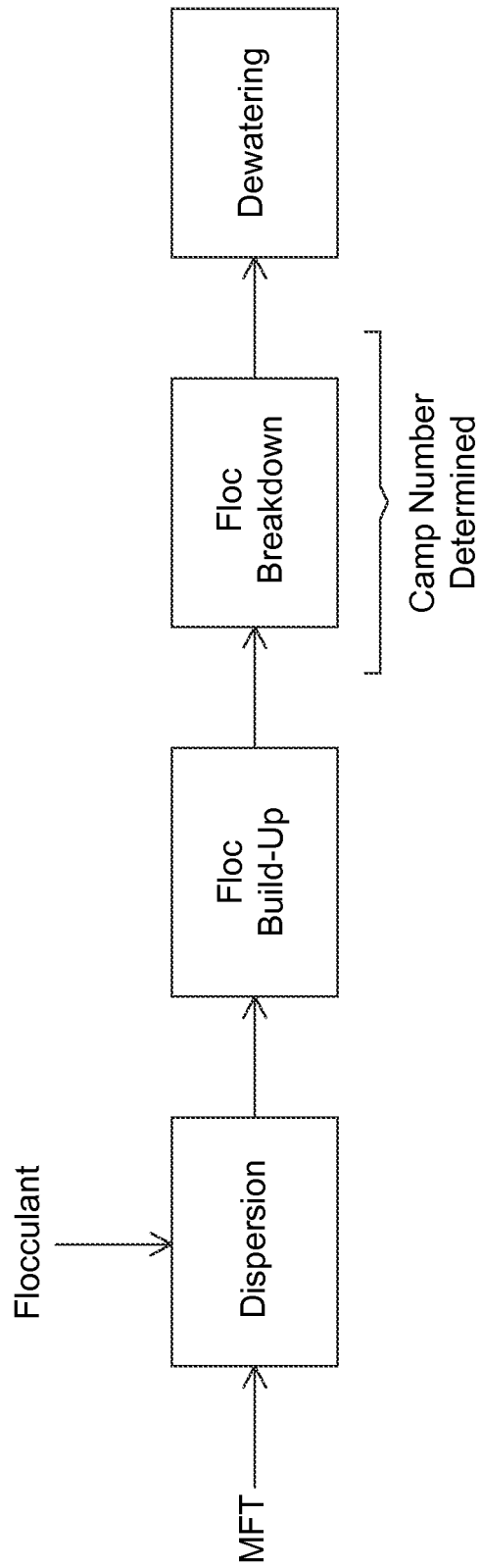
FIG. 9 is another block diagram of a dewatering operation.

Referring to FIG. 9, it should also be noted that the dewatering system may include various assemblies including a dispersion assembly, a floc build-up assembly, a floc breakdown assembly and a dewatering unit. In some implementations, the dispersion, floc build-up and floc breakdown assemblies include pipelines, such that the flocculant is added in-line and the flocculation tailings material is then subjected to conditioning for floc build-up and breakdown in the pipeline section. The dewatering unit may include a sub-aerial deposition site or other types of dewatering units (e.g., a thickener or a filter apparatus) that impart a relatively small amount of shear to the material.

Operating within Water Release Zone

In general, after floc build-up the flocculated tailings material may be handled and conditioned in accordance with a pre-determined shear parameter, such as a Camp Number, such that the flocculated tailings material is conditioned and then dewatered (e.g., deposited) in a state enabling elevated water release. The relevance of proper handling to promote elevated water release and of the shear parameter will be described in greater detail below.

The shear parameter may be considered as a parameter that represents the amount of shear to be imparted to the flocculation tailings material after floc build-up and prior to a dewatering step, such as deposition onto a sub-aerial dewatering site. The shear imparted to the flocculation tailings material has an impact on the development and breakdown of the flocculated matrix. One example of a shear parameter is the Camp Number. The Camp Number is a dimensionless number that generally represents the amount of shear imparted over a certain time interval to a fluid undergoing a flocculation process. The Camp Number is the product of a shear rate (i.e., velocity gradient "G" which has the units of reciprocal seconds) imparted to the fluid, and the time during which the fluid is subjected to that shear rate. Thus, an elevated Camp Number means that the fluid is subjected to an elevated amount of shear, which may be due to high shear rate, high shearing time or both. In other words, a given Camp Number may be obtained by providing high shear rate over a shorter time interval or a lower shear rate over a longer time interval. As will be explained further below, the pre-determined shear parameter, such as a Camp Number, may be used for dimensioning and/or operating the dewatering system such that the flocculated tailings material is subjected to an amount of shear to achieve sufficient floc breakdown such that the flocculated matrix is in a state of high water permeability when deposited or subjected to other dewatering steps.

Figure 2:
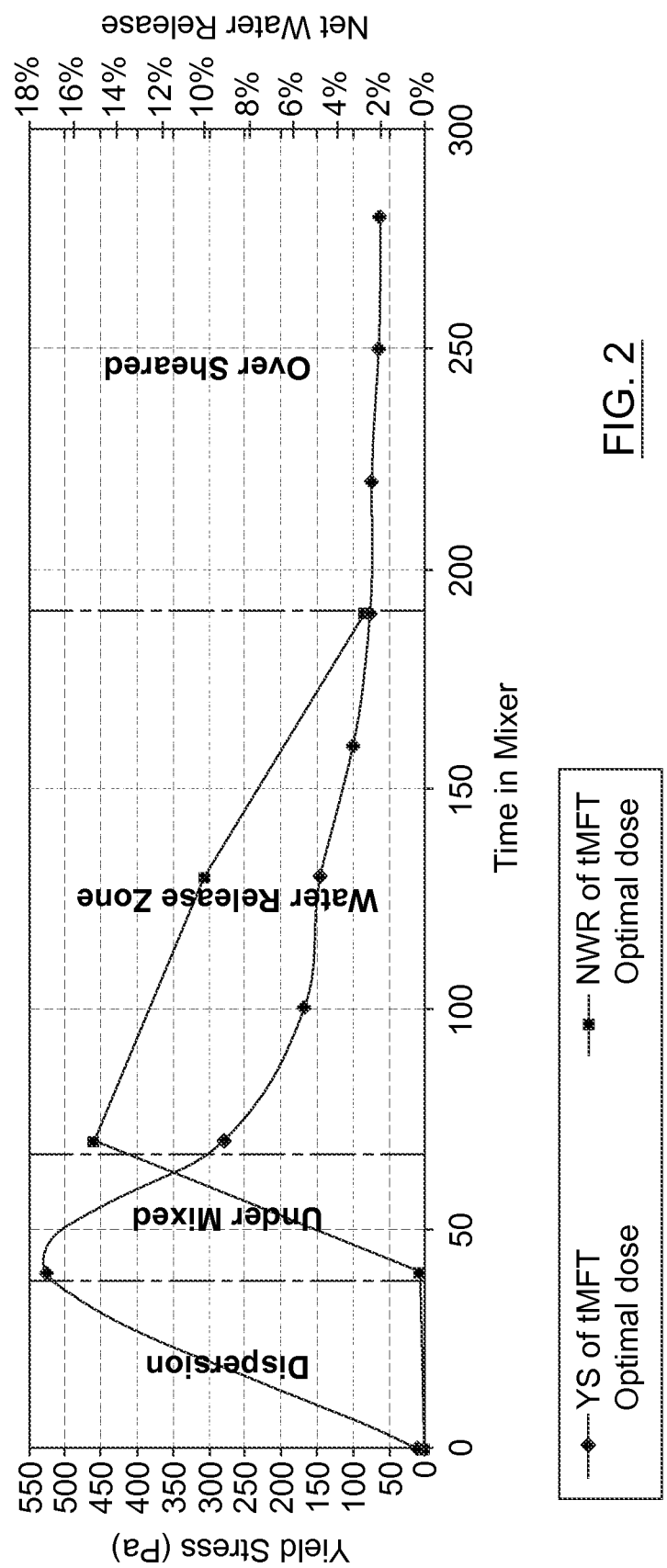
FIG. 2 is a graph of yield stress and net water release versus time in mixer.

Referring to FIG. 2, with reference to an example of tailings flocculation, the rheological evolution of thick fine tailings that is subjected to flocculation may include certain stages:

(a) A dispersion stage where a flocculation reagent is rapidly mixed into the thick fine tailings and the flocculation begins, forming the flocculation tailings material.

(b) A floc build-up stage where the flocculation tailings material increases in yield stress. In this stage, the flocculation tailings material may be considered as a flocculating material. As can be seen in FIG. 2, the flocculation tailings material reaches a peak yield stress. Up to and around this peak yield stress the flocculation tailings material may be said to be "under-mixed" because insufficient mixing or conditioning has been performed to begin to breakdown the flocculated matrix and allow increased water release. FIG. 2 shows that the water release is effectively nil up to a certain point just after the peak yield stress, after which the water release increases up to an initial maximum. Within this floc build-up and under-mixed stage, the flocculation tailings material can resemble a gel state material and this stage also becomes smaller with improved dispersion of the flocculant into the thick fine tailings.

Figure 5:
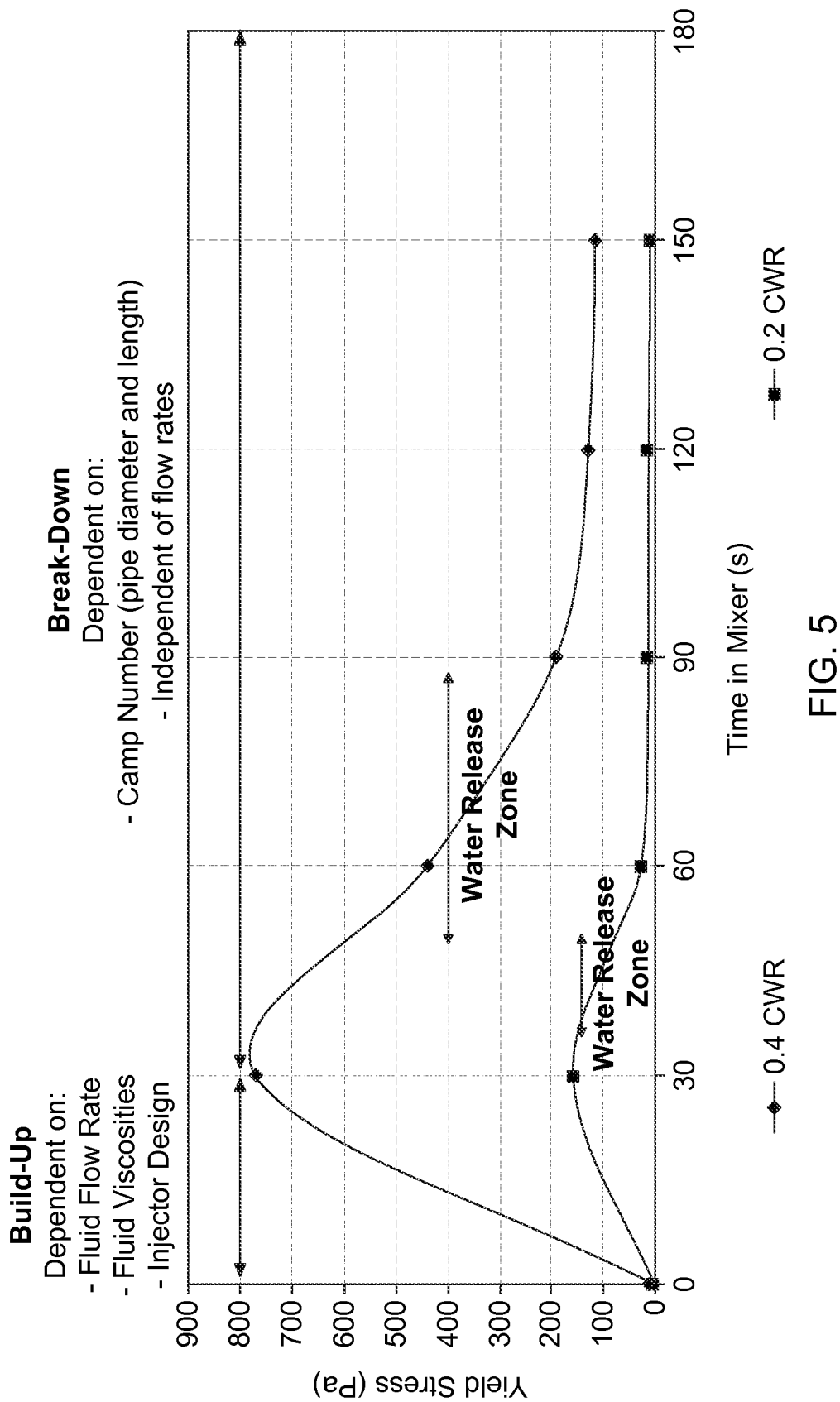
FIG. 5 is a graph of yield stress versus time in mixer.

(c) A floc breakdown stage where the flocculation tailings material decreases in yield shear stress. This stage includes a "water release zone" where water is released from the flocculated matrix. FIGS. 2 and 5, for example, illustrate the water release zone beginning at a certain point within the floc breakdown stage, after the peak water release, and spanning a certain mixing time interval over which the water release gradually decreases. In this stage, the flocculated matrix takes on a more permeable state and water is released within the water release zone.

(d) An over-shear zone, which is avoided, where the flocs are broken down to a point that the material generally returns to a similar state as the initial thick fine tailings. Little to no water can release from the broken down flocculation matrix.

In order to facilitate efficient dewatering operations, it is desirable that the flocculation tailings material be deposited while within the water release zone. Improved performance may also be achieved by modelling or predicting the conditioning that is sufficient to achieve consistent operation within the water release zone.

Figure 3:
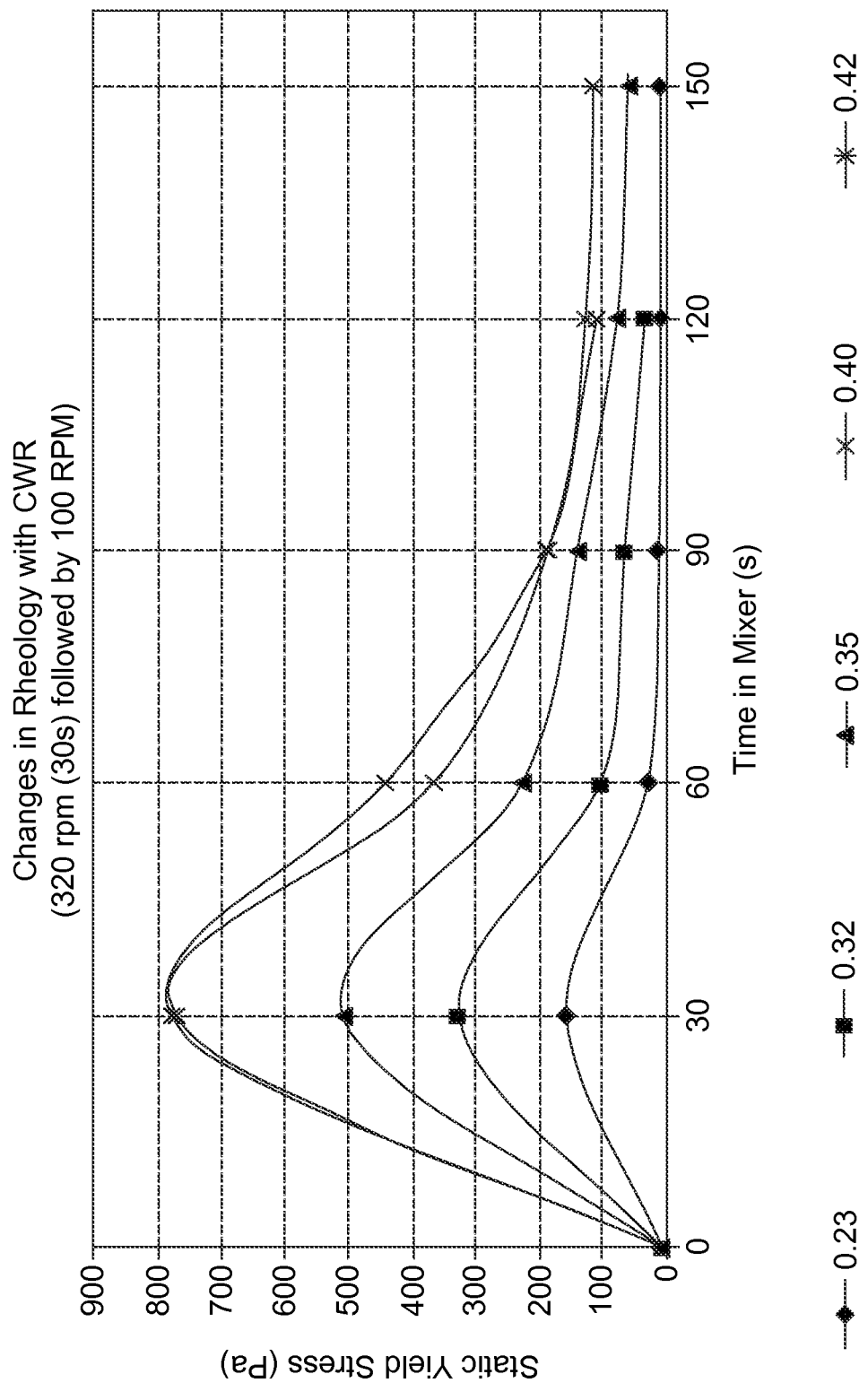
FIG. 3 is a graph of yield stress versus time in mixer.
Figure 4:
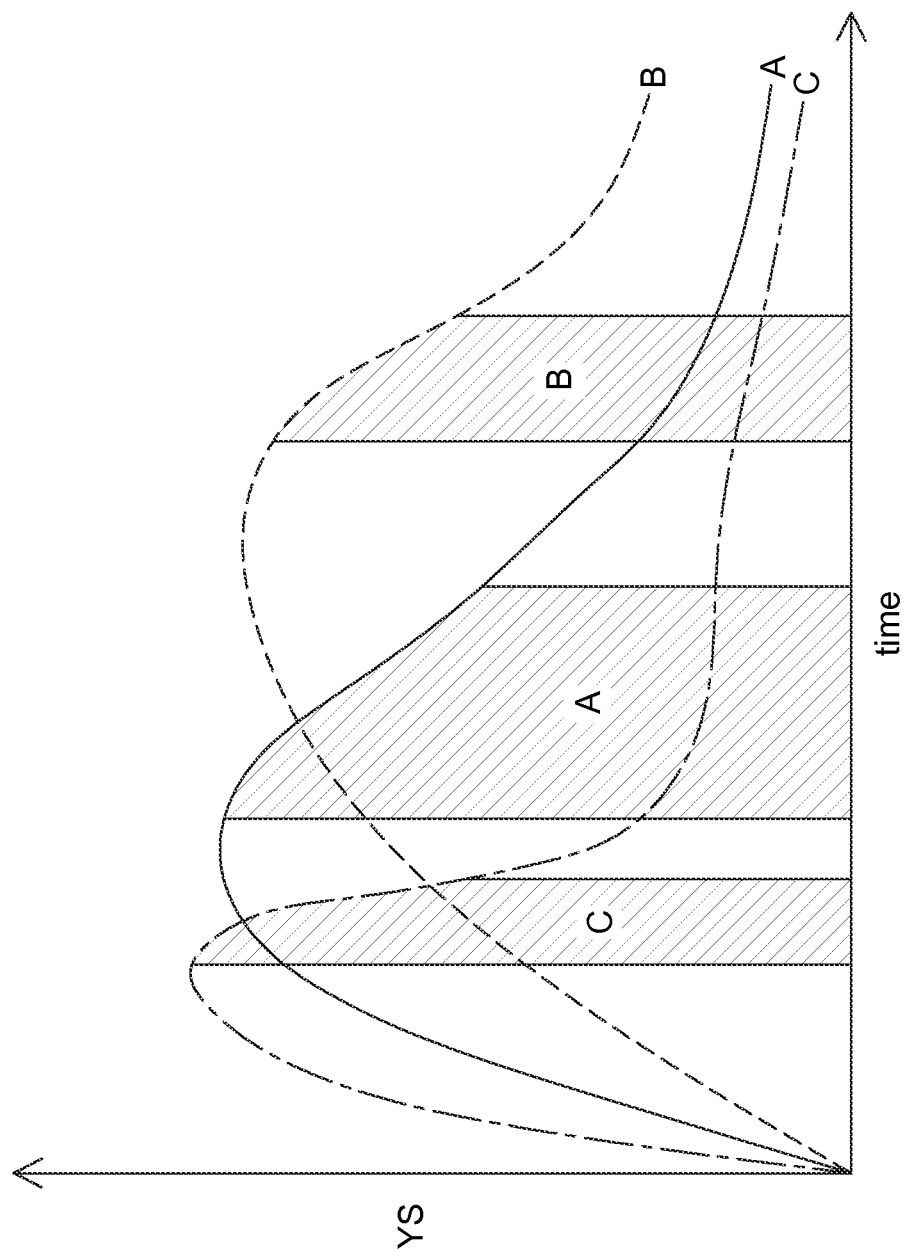
FIG. 4 is a graph of yield stress versus time in mixer.

In this regard, FIGS. 3 and 4 illustrate that different tailings characteristics and/or flocculant characteristics may results in different rheological behavior in response to similar shear conditioning.

FIG. 3 illustrates the static yield stress response of a flocculation tailings material for different MFT samples having different clay-to-water ratios (CWR) from 0.23 to 0.42. Note that the static yield stress response generally increases with higher CWR thick fine tailings.

FIG. 4 schematically illustrates different water release zones (in hash marks) for three different flocculation mixtures A, B and C, which may be caused by different flocculant type, different flocculant dosing and/or different tailings properties, for example. It can be seen that the water release zone may initiate at different times and corresponding shear conditioning levels, and can occupy different intervals. The use of different flocculants on the same MFT can also result in different rheological behavior of the flocculation tailings material. In particular, achieving the water release zone may require more or less shear for a given flocculant and the water release zone may also be smaller or larger for a given flocculant, for example.

Flocculation modelling has improved understanding of floc development and breakdown in the flocculation tailings material. A flocculation model has been developed and some aspects thereof will be described in greater detail below.

In the flocculation model, it may be assumed that rapid and effective dispersion occurs in stage (a). Regarding stage (a), rapid dispersion can aid in the efficient mixing of the flocculant into the tailings and effective floc build-up. Rapid dispersion may be achieved using a number of configurations and devices, some of which are described in co-pending Canadian applications 2,701,317 and 2,705,055. An in-line co-annular flocculant injection arrangement may be used and has been shown to provide effective dispersion. Various other mixing devices may also be used. In addition, a thick fine tailings flow rate above a minimum threshold may also be provided in order to facilitate effective dispersion of the flocculant into the thick fine tailings. In general, the thick fine tailings may be provided with a turbulent flow regime upon contact with the flocculant. When the flocculant is added to the thick fine tailings in-line, the turbulent flow regime may be enabled by providing sufficiently high flow rate for a given pipe diameter and fluid properties (e.g., density and viscosity) and/or a sufficiently small pipe diameter for a given flow rate and fluid properties, for example. When the flocculant is added to the thick fine tailings using other types of mixers, which may include static or mobile mixing elements, the mixer may be sized and operated to enable the turbulent mixing regime to enable rapid dispersion.

Assuming rapid initial dispersion, facilitated by providing a turbulent flow regime, the flocculation model can be split into two sections: build-up and breakdown. FIG. 5 illustrates example floc build-up and floc breakdown stages.

The floc build-up stage can be modelled by computational fluid dynamics (CFD). The peak yield stress is the point where substantially all of the polymer flocculant has been mixed into the thick fine tailings. This build-up stage may be dependent on the injector design, flow rates and viscosities of the two fluids (i.e., tailings and flocculant). In some implementations, the build-up stage may occur within a floc build-up assembly that may be a floc build-up pipeline section downstream from the injection point of the flocculant.

The floc build-up pipeline section may also include in-line shear devices, for example when a shorter pipeline section is desired. In some implementations, the floc build-up stage may at least partially occur within a tank mixer in which the flocculant is added and mixed. In the floc build-up stage, the flow regime of the flocculation tailings material may transition from a turbulent regime to a laminar regime due to the thickening effect of the flocculation.

The floc breakdown stage can be modeled or determined by consideration of a shearing parameter, such as the Camp Number. In the breakdown stage, the flocculation tailings material may be provided with a laminar flow regime. The laminar flow regime may be enabled by providing sufficiently low flow rate for a given pipe diameter and fluid properties (e.g., density, viscosity, yield stress, etc.) and/or a sufficiently large pipe diameter for a given flow rate and fluid properties. It should also be noted that the flocculation tailings material entering the breakdown stage has a well-developed flocculated matrix, which facilitates the laminar flow regime due to the elevated viscosity of the material. In some scenarios, the pipeline sections used to supply the thick fine tailings and to condition the flocculation tailings material have substantially the same diameter, and in such scenarios the Reynolds Number (Re=$\rho v D/\mu$, where $\rho$ is the density of the fluid, v is the mean velocity of the fluid, D is the hydraulic diameter of the pipe for flow in a pipe, and $\mu$ is the dynamic viscosity of the fluid) of the flocculation tailings material decreases mainly due to an increase in the viscosity of the material compared to the thick fine tailings prior to flocculation. Thus, the flow rate and the dimensions of the overall dewatering system (e.g., units and piping) may be such that the fluid has a turbulent flow regime prior to and in the flocculant dispersion stage, the fluid transitions from a turbulent to a laminar flow regime during the floc build-up stage, and the fluid has a laminar flow regime in the breakdown stage.

In some implementations, the floc breakdown assembly that transports a laminar flow of the flocculation tailings material within the breakdown stage may be dimensioned based on the Camp Number. The floc breakdown assembly may consist essentially of a pipeline, which may facilitate construction, design and maintenance compared to more complex equipment setups. The breakdown stage may be modeled based on the Camp Number, where the total amount of shear imparted to the flocculated material is sufficient to achieve the water release zone upon deposition of the material. The Camp Number can be used to determine the desirable pipe diameter and length for the laminar flow of the flocculated tailings material within the breakdown stage.

In addition, the floc breakdown assembly may be provided based on the Camp Number and independent of the flow rate of the flocculated tailings material. Considering a given pipe diameter and length, material with high flow rates will be subjected to high shear rates but for short times while material with low flow rates will subjected to lower shear rates but for longer times; the overall shear experienced by the material is substantially the same for the two cases. By way of example, a given Camp Number may be achieved by providing a small pipe diameter and a short pipe length, or by providing a larger pipe diameter and a longer pipe length. The flow rate of the flocculated tailings material may nevertheless be considered in the dimensioning of the breakdown assembly (e.g., the breakdown pipeline section) in order to provide the laminar flow regime.

The breakdown stage can thus be designed and controlled based on the Camp Number, which is fixed for a given length and diameter of pipe. The breakdown stage can also be designed and controlled relatively independently of flow rate of the material that has a laminar flow regime.

As the thick fine tailings feed type modifies the initial mixing parameters and Camp Number required for achieving the water release zone, each dewatering system can be set up with a floc breakdown assembly (e.g., a pipeline configuration having pipe dimensions including length(s) and diameter(s) of one or more pipe sections) suitable for the range of thick fine tailings feeds it may receive. It should be noted that the floc breakdown assembly may consist essentially of a pipeline configuration, which may include one or more pipe sections each having a corresponding pipe length and diameter that may be the same or different for each pipe section. The pipeline configuration of the floc breakdown pipeline section may be provided so as to impart an amount of shear according to a pre-determined shear parameter (e.g., Camp Number). The floc breakdown assembly may include in-line shear devices, such as static mixers and the like, that may impart shear and may be considered as having an equivalent pipe length for the design and operation of the system.

In some implementations, the method of treating thick fine tailings, such as MFT that may be derived from oil sands mining or other types of mining, includes flocculating the MFT in a flocculant dispersion stage, a floc build-up stage and a floc breakdown stage. The floc breakdown stage includes imparting a pre-determined amount of shear conditioning to the flocculation tailings material in accordance with a shearing parameter, such as the Camp Number, sufficient that the flocculation tailings material is within the water release zone. The method may also include depositing the flocculation tailings material within the water release zone, for example onto a sub-aerial deposition area.

The pre-determined amount of shear conditioning in the floc breakdown stage may be provided by a floc breakdown pipeline assembly that is configured for that purpose. The floc breakdown pipeline assembly may be sized, configured and constructed based on the pre-determined shear or retrofitted in order to add or remove pipe sections, thereby adjusting overall pipe length to achieve the desired Camp Number. The floc breakdown pipeline assembly may include in-line shear devices, such as an in-line mixer, having an equivalent pipe length value that is taken into account for the pre-determined shear. The floc breakdown pipeline assembly may also consist essentially of a pipeline with associated valves and fittings as needed for operation, without any other in-line shear devices.

The pre-determined amount of shear conditioning may be provided by Camp Number scaling from laboratory scale mixer tests up to the pipeline assembly. Implementations of the Camp Number scaling methodology will be further described below.

In some implementations, the floc breakdown pipeline assembly may include a plurality of lines for transporting and depositing the flocculation tailings material into respective deposition areas, at least some of the lines being configured to have substantially the same length and diameter. The floc breakdown pipeline assembly may be configured to provide substantially equivalent shear conditioning through each line that feeds a corresponding deposition area or other dewatering unit. This enables treatment of a same thick fine tailings source with alternating or rotating deposition into different deposition areas, which is typically required to allow material deposited into a given area time to dewater and dry before additional flocculation tailings material is deposited. Various pipeline configurations are possible in this regard.

In some implementations, the floc breakdown pipeline assembly may have at least some lines that are configured to have different lengths and/or different diameters. In one scenario, the floc breakdown pipeline assembly may include smaller diameter and shorter length pipe sections for transport and deposition into proximate deposition areas, as well as larger diameter and longer length pipe sections for transport and deposition into more distant deposition areas, thereby providing substantially similar total shear according to a pre-determined shear parameter, such as the Camp Number, to the flocculated material deposited at both proximate and distant locations. In another scenario, the lines have different lengths or diameters, and one or more of such lines can be selected to receive a flow of the flocculation tailings material in accordance with a corresponding predetermined amount of shear conditioning that should be imparted to that flow of material. For instance, there may be longer and shorter lines, and the longer lines may be used when the pre-determined shear is higher and the shorter lines would be used when the pre-determined shear is lower, thereby imparting an appropriate amount of shear to different flocculation tailings materials. There may also be lines of smaller diameter and lines of larger diameter for performing similar selective shearing on different flocculation tailings materials. The floc breakdown pipeline assembly may have various configurations with different line lengths and diameters, and may include a pipeline network with appropriate valves and branches so as to provide a given desired pipe length and diameter to transport and condition a flow of flocculation tailings material to a given deposition area or other dewatering unit.

In some implementations, the method of treating thick fine tailings includes: dispersing a flocculant into the thick fine tailings to form a flocculating mixture; shearing the flocculating mixture to increase a yield stress of the flocculating mixture and build up flocs, thereby producing a flocculated mixture; shear conditioning the flocculated mixture to decrease the yield stress of the flocculated mixture and break down flocs, wherein the shear conditioning is performed in accordance with a pre-determined shearing parameter sufficient to produce a conditioned flocculated material that is within a water release zone wherein release water separates from the conditioned flocculated material; and dewatering the conditioned flocculated material while within the water release zone.

In some implementations, there is a method of determining shear conditioning for a flocculated thick fine tailings material to achieve floc breakdown and water release, including Camp Number scaling from laboratory scale mixer tests up to a commercial scale pipeline assembly.

The Camp Number scaling may include determining rheological behaviour of a sample flocculated mixture comprising a sample of the thick fine tailings and the flocculant in the laboratory scale mixer; determining a laboratory scale Camp Number sufficient to bring the sample flocculated mixture within a water release zone in the laboratory scale mixer; determining the Camp Number so as to be substantially similar to the laboratory scale Camp Number; and determining an equivalent pipe length and diameter for the pipeline assembly based on the Camp Number.

The sample flocculated mixture may be formed by rapid dispersion of the flocculant into the sample of thick fine tailings, and the floc build-up stage may be determined using empirical and/or CFD methods. The floc build-up stage may be determined based on reaching a peak yield stress, for example. The dispersion and floc-build-up stages may thus be predicted for the up-scaled dewatering system. Thus, the dewatering system may be designed and controlled such that the floc build-up pipeline assembly downstream of the flocculant injection point imparts sufficient shear to the flocculation tailings material to reach a peak yield stress and thus enter the floc breakdown stage upon reaching the floc breakdown pipeline assembly that was designed based on the Camp Number for achieving the water release zone.

It should also be noted that the floc build-up assembly may include a mixer, such as a tank impeller mixer, which imparts sufficient shear to increase the yield stress of the flocculating mixture. The flocculated mixture may then be withdrawn from the tank mixer and supplied to the floc breakdown assembly, which may be a pipeline assembly. Thus, the floc build-up and breakdown stages may be managed by various combinations of equipment, such as mixers and pipelines.

In some cases, the nature or properties of the source thick fine tailings may change. In such cases, the rheological behaviour of the flocculation tailings material may also be affected, thus changing the shear requirements to achieve the water release zone. Other modifications to the flocculating step (such as the use of a different flocculant, a different flocculant solution or formulation and/or flocculant dosage) may also have the effect of altering the shear requirements to achieve the water release zone. In such cases, the method may include determining a new Camp Number and a new pre-determined amount of shear conditioning, which correspond to the new modified flocculating characteristics; and imparting the new pre-determined amount of shear conditioning to the flocculated tailings material sufficient that the flocculated tailings material is within the water release zone. The floc breakdown pipeline assembly may be re-configured to increase or decrease the equivalent pipe length and/or diameter, as required, depending on the new Camp Number.

The step of determining rheological behaviour may include determining an optimal flocculant dose range; adding the flocculant into a thick fine tailings sample at the optimal flocculant dose range, to form a mixture; imparting dispersive mixing to the mixture in order to promote dispersion of the flocculant and floc build up; and imparting lower mixing to the mixture in order to further promote floc build up and to commence floc breakdown until reaching the water release zone.

Figure 8:
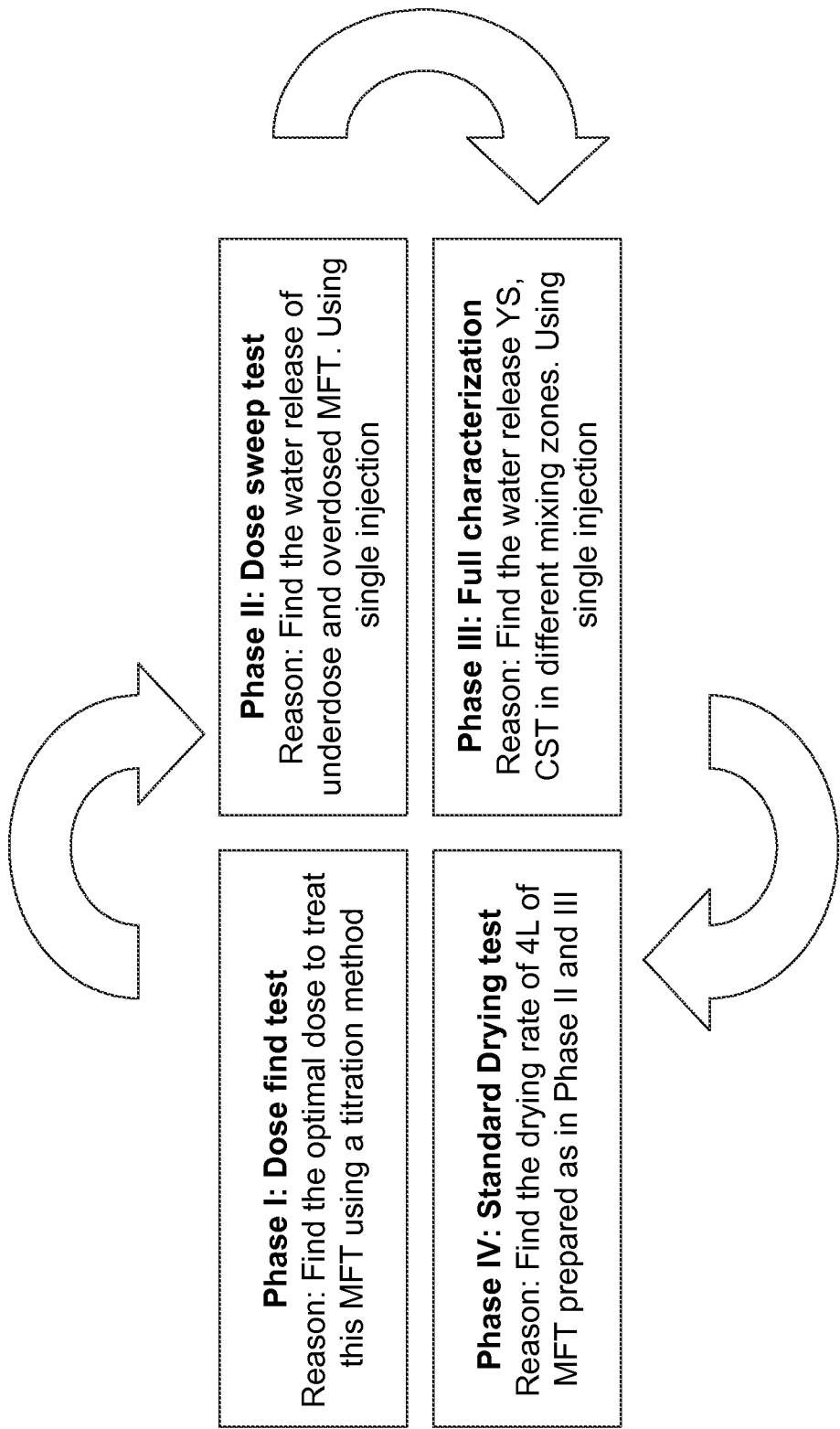
FIG. 8 is a block diagram of a flocculant dosing test procedure.

Determining rheological properties of the flocculation may be effective since different thick fine tailings, flocculant types, and flocculant dosages can result in different rheological behaviour of the flocculated tailings. A sample of thick fine tailings may be obtained and tested in order to determine an optimal flocculant dose, which may be on a clay basis. The flocculant dosage testing may involve conducting sweeps of different flocculant doses in a laboratory mixer and measuring the rheological response of the flocculating mixture. One test in this regard, which may be called the fast-slow mixer test, includes an initial stage of vigorous agitation (e.g., 320 rpm) of the flocculating mixture to simulate initial rapid dispersion of the flocculant into the tailings, followed by a stage of slower agitation (e.g., 100 rpm) to simulate the conditioning stage which may be done in a pipeline with lower shear levels compared to the dispersion stage. FIG. 8 shows an example of a test protocol for determining an optimal polymer dose.

In addition to determining an optimal flocculant dose, determining rheological properties of the flocculation may include determining the relationship between static yield stress and time in the mixer, as well as determining the water release characteristics. The static yield stress may be used as an indicator of the floc build-up and floc breakdown stages. For example, the peak yield stress may be used as an approximation of the end of the floc build-up stage and the onset of the floc breakdown stage.

Some implementations provide a method of designing a pipeline assembly for transporting and conditioning a laminar flow of flocculated thick fine tailings material to a dewatering unit. The design method may include subjecting a sample of flocculated thick fine tailings material to shear and determining a sample shearing parameter comprising residence time and shear rate sufficient to bring the flocculated sample within a water release zone where release water separates from the sample; and configuring the pipeline assembly so as to have a pipe length and diameter providing a pipeline shearing parameter that is substantially similar to the sample shearing parameter.

Some implementations provide a method of dewatering thick fine tailings that may utilize the design method described above. For instance, the dewatering method may include the steps of flocculating the thick fine tailings to produce a flocculated thick fine tailings material; shear conditioning the flocculated thick fine tailings material in a pipeline assembly sized and configured according to a pipeline shearing parameter that is substantially similar to a pre-determined sample shearing parameter comprising residence time and shear rate sufficient to bring a sample of the flocculated thick fine tailings material within a water release zone where release water separates from the sample, the pipeline assembly producing a conditioned flocculated material within the water release zone; and dewatering the conditioned flocculated material while within the water release zone. In some scenarios, the flow of the flocculated thick fine tailings material in a pipeline assembly has a laminar flow regime and the pre-determined shear parameter is a Camp Number.

In some implementations, there is a treatment system for treating thick fine tailings. The system may include a mixing device for mixing a flocculant into the thick fine tailings to form a flocculating mixture; a first shearing assembly for subjecting the flocculating mixture to shear to increase a yield stress of the flocculating mixture and build up flocs, thereby producing a flocculated mixture; a pipeline conditioning assembly sized and configured for subjecting the flocculated mixture to an amount of shear conditioning in accordance with a pre-determined shearing parameter sufficient to decrease the yield stress of the flocculated mixture and produce a conditioned flocculated material that is within a water release zone wherein release water separates from the conditioned flocculated material; and a dewatering unit for receiving the conditioned flocculated material while within the water release zone, for producing release water and dewatered tailings material.

While Camp Number scaling has been shown to be an efficient and effective method of determining the configuration of the pipeline assembly for the thick fine tailings dewatering facility, it should also be noted that other shear parameters may be used in certain circumstances. For example, a shear parameter that includes residence time, shear rate and possibly other variables may be determined at laboratory and/or pilot scale and used for scaling up to pipeline assemblies for larger dewatering operations. Additional variables may include various other characteristics of the dewatering system and may be empirically determined. Camp Number scaling has been shown to be a relatively simple and reliable method, but the scaling may be further refined by adjusting a Camp Number-based shear parameter with additional components that may be related to the physico-chemical properties of the thick fine tailings, the flocculant, the flocculant solution and/or other constituents or properties of the dewatering system. For example, when additional in-line shear devices are provided as part of the transportation and conditioning assembly, the Camp Number scaling may be adapted based on empirically derived constants or variables that depend on the given type of in-line shear device. Static mixers and tank impeller mixers may impart the same average amount of shear to the flocculation tailings material, but the distribution of the shear imparted to the material may be slightly different due to construction and operating differences between the two devices (e.g., dead zones may exist in tank impeller mixers and thus a portion of the flocculation tailings material may experience less shear than the rest of the material). While other perhaps more complex shear parameters may be used to scale the dewatering operations, the Camp Number has been shown to be an efficient and effective parameter.

In addition, when the flocculated thick fine tailings material in the floc breakdown assembly has a laminar flow regime, the pre-determined shear parameter may be a Camp Number. In other scenarios, when the flocculated thick fine tailings material has a turbulent and/or transitional flow regime in the floc breakdown assembly, other shear parameters should be used for scaling.

In some implementations, the Camp Number scaling method may be used as a monitoring method for ongoing dewatering operations, in order to adjust or fine tune the process to maximize water release. For example, an existing floc breakdown pipeline assembly may be brought offline and adjusted by adding or removing pipe section(s), thereby changing the overall length of the floc breakdown pipeline assembly, in accordance with a new laboratory Camp Number that was determined or estimated based on the incoming thick fine tailings.

In determining the Camp Number or another shear parameter including a shear rate component, the shear rate may be taken as an average shear rate over the time interval. The average shear rate may be approximated or estimated according to empirical correlations or other calculation methods. The Camp Number may also be a composite of multiple Camp Number components obtained for a series of time increments, each having a corresponding shear rate or a corresponding average shear rate. The Camp Number components may be used for providing corresponding sections of the floc breakdown assembly.

Various aspects and implementations of the methods described herein will be further understood in light of the following example section.

Examples, Experiments and Calculations

A mixer model was developed for a laboratory scale paddle mixer. Laboratory data has been obtained and compiled for many different types of mature fine tailings having different characteristics, and includes rheological, dosage and water release capabilities of the tailings materials.

A mixer model was developed with the data that had been obtained using the laboratory paddle mixer. The breakdown of the rheological properties of the flocs in the laboratory paddle mixer have been well characterized to correlate with clay to water ratio (CWR). At the same time, laboratory test rig and field tests of pipe flow had exhibited similar trends in the rheological properties. However, in order to generate a laboratory mixer model, methods were developed to obtain the Herscehel-Bulkley fluid rheological properties of the treated MFT so a range of shear rates could be considered. This was successfully performed on two MFTs with identical properties to pressure tap trials along a pipeline test rig. It was clear there was a correlation between the mixer and length of pipe required for flocculation in commercial application 12" pipe and in the test rig 2" pipe (26 meters and 4 meters respectively, correlates to 30 seconds in the laboratory mixer). The results of the laboratory mixer allowed the understanding that the shape of the pressure profiles downstream of the initial injection/mixing scaled with Camp Number (shear rate×time). Assuming sufficient initial mixing, the peak pressure drop occurs at substantially the same distance downstream of the initial mixing independent of flow rate. This result indicates that if sufficient initial mixing occurs, the breakdown of flocs can be accurately predicted using the Camp Number.

In one study, computational fluid dynamics (CFD) was used to analyze laboratory data at different specific gravities and mixing speeds to ascertain whether the change in rheological properties may be correlated to absorbed energy.

Rheology of Treated MFT:

The first task in the analysis of paddle mixer data with treated MFT was to characterize the rheological properties of the mixture. In past studies—both with the laboratory paddle mixer and in pipe flow test—only the static yield stress was measured. However, to develop a comparative model between the paddle mixer data and pipe flow tests, the behavior of the mixture over a range of shear rates was preferred. This behavior can be obtained from a Brookfield vane rheometer by measuring the Torque-Speed curve or flow curve.

Figure 6:
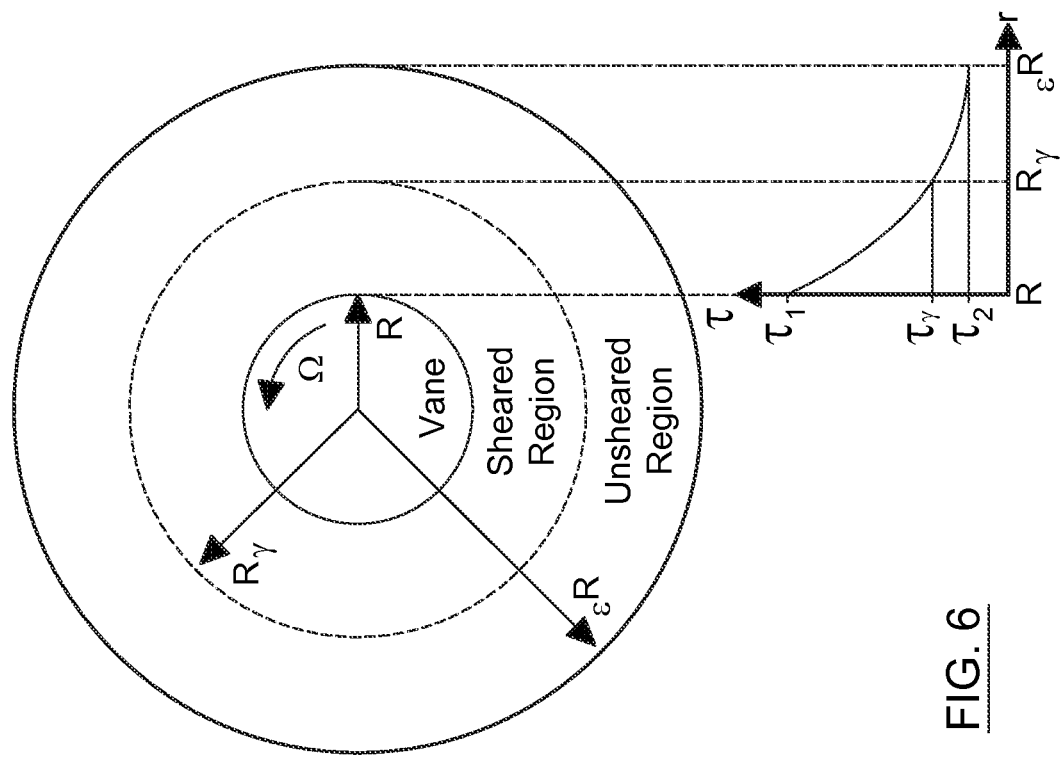
FIG. 6 is a schematic of the geometry and stress profile in a large gap concentric system for a fluid with a yield stress.

FIG. 6 shows the geometry and stress profile in a large gap concentric system for a fluid with a yield stress. This system is an accurate representation of the vane and cylinder system used in the laboratory and field tests to measure the rheological properties of MFT and flocculant-MFT mixtures. When the vane rotates at constant angular velocity $\Omega$, the shear stress $\tau$ at the vane periphery (neglecting end effects) is related to the torque T by:

$$\tau = \frac{T}{2\pi R^2 L} = \frac{2T}{\pi D^2 L} \qquad (1)$$

where R and D are the vane radius and diameter, respectively, and L is the vane length. Now, the relationship between the angular velocity and the shear rate $\gamma$ is given by:

$$\Omega = \int_R^{R_y} \frac{\dot{\gamma}}{r} dr = \frac{1}{2} \int_\tau^{\tau_y} \frac{f(\tau)}{\tau} d\tau \qquad (2)$$

and differentiating both sides of Eq. (2) with respect to $\tau$, the following direct relationship between angular velocity and shear rate is obtained:

$$\dot{\gamma} = \frac{2\Omega}{\frac{d\ln\tau}{d\ln\Omega}}. \qquad (3)$$

Figure 7:
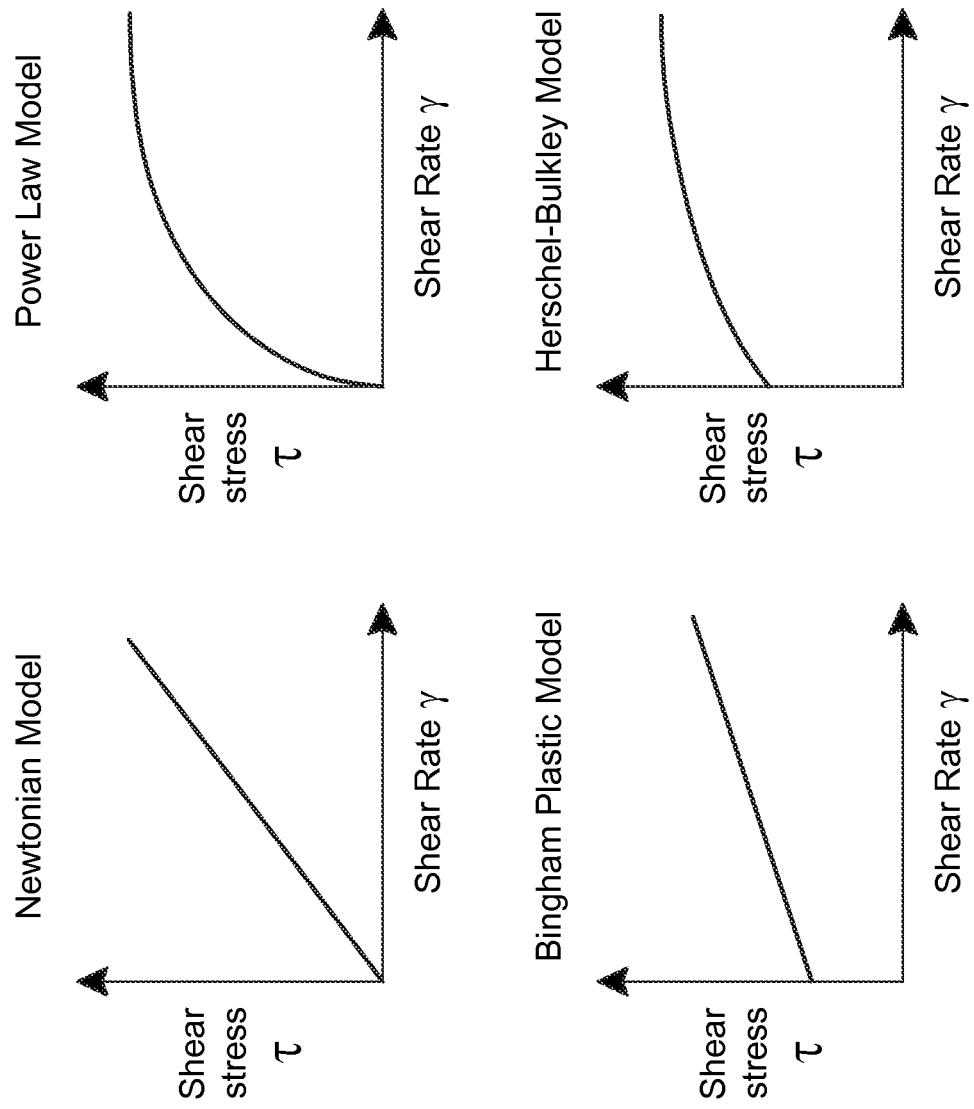
FIG. 7 is a series of graphs of shear stress versus shear rate for different fluid models.

From this basic information, a shear stress vs. shear rate curve can be calculated and then fit to a common non-Newtonian fluid model, such as the Herschel-Bulkley equation of the form:

$$\tau = \tau_y + k\dot{\gamma}^n \qquad (4)$$

where k is the consistency index, n is the power-law index and $\tau_y$ is the yield stress. When the power-law index n=1, it reduces to the expression for a Bingham plastic, as shown in FIG. 7. Note that the raw data output from the Brookfield rheometer consists of the rotational speed N (in RPM) and the % torque T, so the actual torque can be calculated from:

$$T = K_s \frac{\overline{T}}{100} [N-m] \quad (5)$$

where the spring constant Ks is given in Table 1. The rotational speed can be converted to radians/second using:

$$\Omega = \frac{2\pi N}{60}. \quad (6)$$

TABLE 1

Parameters of Brookfield Rheometer

| Model | Spring Constant $K_s$ |
|---|---|
| HA | 0.0014374 |
| HB | 0.0057496 |
| RV | 0.0007187 |

| Vane | Vane Length cm | Vane Diameter cm |
|---|---|---|
| V-71 | 6.878 | 3.439 |
| V-72 | 4.338 | 2.167 |
| V-73 | 2.535 | 1.267 |

TABLE 1-continued

Parameters of Brookfield Rheometer

| V-74 | 1.176 | 0.589 |
|---|---|---|
| V-75 | 1.61 | 0.803 |

Paddle Mixer Analysis:

Paddle mixer experiments with two different MFT samples were conducted and rheological flow curves, as well as the static yield stress, were measured after approximately every 30 seconds of mixing. From each flow curve, a shear stress vs. shear rate plot was calculated as described above and fit to a Herschel-Bulkley model. The first sample was Pond B MFT with a 47.21% solids content and 582 g/t of 0.45% polymer flocculant solution. The mixing time, mixer speed, static yield stress and the curve-fit coefficients for the Herschel-Bulkley model are given in Table 1. Then, using these curve-fit coefficients, a CFD model of the paddle mixer was run to determine the torque on the paddle as well as the shear rate, which are also tabulated in Table 1. Knowing the torque and the mixer speed, the power P can be calculated from:

$$P = T\Omega. \quad (7)$$

The cumulative absorbed specific energy E is simply the power (per unit volume) multiplied by the time in the mixer or:

$$E_n = \sum_{i=1}^{n} \frac{P_i \Delta t_i}{V}. \quad (8)$$

where V is the paddle mixer volume. Lastly, the Camp Number may be calculated using the volume averaged shear rate G from the CFD simulation and the incremental mixing time $\Delta t$ according to:

$$\text{Camp No.} = G\Delta t. \quad (9)$$

TABLE 2

Treated MFT parameters for Pond 8A MFT in a paddle mixer.

| Mixing Time, t s | Mixer Speed N RPM | Static Yield Stress Pa | $\tau_2$ Pa | n | k kg s$^{n-2}$/m | Torque, T mN-m | Power, P W | Cumulative Absorbed Energy, E W-h/m³ | Shear Rate, G s$^{-5}$ | Camp No. |
|---|---|---|---|---|---|---|---|---|---|---|
| 0 | — | 7.13 | — | — | — | — | — | — | — | — |
| 9 | 320 | 515.10 | 69.0 | 0.345 | 10.68 | 46.98 | 1.574 | 13.02 | 43.06 | 387.58 |
| 20 | 320 | 171.09 | 44.9 | 0.408 | 6.29 | 36.13 | 1.211 | 25.27 | 44.94 | 494.33 |
| 50 | 100 | 104.15 | 32.1 | 0.619 | 3.70 | 21.37 | 0.224 | 31.44 | 13.16 | 395.52 |
| 80 | 100 | 61.30 | 25.6 | 0.619 | 3.41 | 18.16 | 0.190 | 36.68 | 13.27 | 397.99 |
| 110 | 100 | 51.90 | 23.2 | 0.772 | 2.99 | 21.37 | 0.224 | 42.85 | 13.88 | 410.30 |
| 140 | 100 | 47.66 | 25.4 | 0.879 | 2.15 | 22.94 | 0.240 | 49.48 | 13.78 | 413.43 |

The results of a similar analysis for a Pond D 22% solids by weight (SBW) MFT with 896 g/t of 0.45% polymer solution are given in Table 3.

TABLE 3

Treated MFT parameters for STP 22% SBW MFT in a paddle mixer.

| Mixing Time s | Mixer Speed RPM | Static Yield Stress Pa | $\tau_2$ Pa | n | k kg s$^{n-2}$/m | Torque mN-m | Power W | Cumulative Absorbed Energy W-h/m³ | Shear Rate s$^{-2}$ | Camp No. |
|---|---|---|---|---|---|---|---|---|---|---|
| 0 | — | 1.99 | — | — | — | — | — | — | — | — |
| 20 | 320 | 165.80 | 39.3 | 1.0 | 0.040 | 25.90 | 0.868 | 15.98 | 48.75 | 975.10 |
| 50 | 100 | 88.58 | 30.3 | 1.0 | 0.121 | 13.45 | 0.141 | 19.84 | 12.73 | 381.85 |

TABLE 3-continued

Treated MFT parameters for STP 22% SBW MFT in a paddle mixer.

| Mixing Time s | Mixer Speed RPM | Static Yield Stress Pa | $\tau_2$ Pa | n | k kg s$^{n-2}$/m | Torque mN-m | Power W | Cumulative Absorbed Energy W-h/m$^3$ | Shear Rate s$^{-2}$ | Camp No. |
|---|---|---|---|---|---|---|---|---|---|---|
| 80 | 100 | 68.78 | 28.7 | 1.0 | 0.140 | 12.29 | 0.129 | 23.39 | 12.81 | 384.44 |
| 110 | 100 | 53.37 | 22.1 | 1.0 | 0.153 | 10.65 | 0.112 | 26.47 | 12.94 | 388.09 |
| 140 | 100 | 40.00 | 19.4 | 1.0 | 0.149 | 9.58 | 0.100 | 29.23 | 13.01 | 390.18 |
| 170 | 100 | 33.80 | 16.3 | 1.0 | 0.165 | 8.53 | 0.088 | 31.70 | 13.16 | 394.75 |

The static yield stress is always considerably higher than the yield stress obtained from the shear stress-shear rate plots, since the vane is not rotating at constant speed for rheometer test. It is also interesting to note that the Camp Number for both paddle tests were similar in magnitude and, in addition, the cumulative absorbed energy at the point which the static yield stress starts to decline dramatically was similar in magnitude—about 20 W-h/m$^3$—to the measurements made by Pornillos.

The mixer cylinder diameter was 10.5 cm and the paddle dimensions were 7.62 cm×2.54 cm; the total MFT volume was about 300 mL.

Pipe Flow Analysis:

The two different MFT samples were similar to the MFT used in the dedicated disposal area (DDA) commercial scale tests conducted in 12" pipe and the laboratory rig tests conducted in 2" pipe, respectively. For both of these MFT samples, the rheological parameters determined from the paddle mixing experiments were input to a CFD model of a pipe with periodic boundary conditions, from which the pressure gradient and volume averaged shear rate were determined. From the calculated values of average shear rate, the equivalent length of pipe was determined to provide the same Camp Number. The results are tabulated in Tables 4 and 5.

Based on the results in Tables 4 and 5, there is a correlation between the time increment in the mixer and the length of pipe required to provide the same shear experience: for the 12" pipe, a length of about 26 m is equivalent to 30 seconds in the paddle mixer. In addition, this length is substantially independent of flow rate since at lower flow rates the shear rate is lower, but so is the speed so it takes a longer time to reach the same distance downstream. Likewise, at higher flow rates the shear rate is higher, but due to the higher speed, it takes less time to reach a particular distance downstream. Camp Number scaling has been demonstrated for this application.

For the DDA tests, the discharge location was about 80 meters downstream of the injection point. Disregarding the initial mixing right after the injector, the shear experience of the treated MFT at the exit of the pipe would be roughly equivalent to 80 seconds in the paddle mixer, based on the required pipe length to produce the same Camp Number. In laboratory paddle mixing tests, this amount of mixing has been shown to correspond approximately to the optimum mixing for maximum dewatering. In the DDA tests, it was observed that better water release was observed at higher tailings flow rates (>550 m$^3$/h) while at lower flow rates (350-450 m3/h) there seemed to be too little initial mixing of the polymer, which reduced subsequent water release. However, in those tests, the initial injection mixing was not independent of the flow rate: the higher the flow rate, the better the initial mixing. The measured pressure gradient along the 12" pipe for the lowest polymer dosage at 550 m$^3$/h varied between 1100-1900 Pa/m, which is close to the same range predicted by the CFD results (see Table 4).

In another laboratory test, the initial injection mixing was set at a relatively high flow rate and then the flow rate through an instrumented downstream section was varied using a diversion valve. In this manner, lower flow rates in the downstream section were not subject to less initial mixing. The results of the laboratory test showed that the shape of the pressure profiles downstream of the initial injection mixing scaled with Camp Number, showing that the peak pressure drop occurs at the same distance downstream of the initial mixing. This result indicates that if sufficient initial mixing occurs, the degradation downstream can be accurately predicted using the Camp Number.

TABLE 4

Treated MFT parameters for Pond 8A MFT in a 12" pipe at 550 m$^3$/h.

| Mixing Time, t s | Mixer Speed N RPM | Static Yield Stress Pa | $\tau_2$ Pa | n | k kg s$^{n-2}$/m | Camp No. | Shear Rate, G s$^{-2}$ | Pipe Length m | Pressure Gradient, dP/dx Pa/m |
|---|---|---|---|---|---|---|---|---|---|
| 9 | 320 | 515.10 | 69.0 | 0.345 | 10.68 | 387.58 | 30.07 | 26.99 | 2190.17 |
| 20 | 320 | 171.09 | 44.9 | 0.408 | 6.29 | 494.33 | 30.17 | 34.31 | 1732.78 |
| 50 | 100 | 104.15 | 32.1 | 0.619 | 3.70 | 395.52 | 31.14 | 26.60 | 1990.78 |
| 80 | 100 | 61.30 | 25.6 | 0.619 | 3.41 | 397.99 | 31.13 | 25.77 | 1828.34 |
| 110 | 100 | 51.90 | 23.2 | 0.772 | 2.99 | 410.30 | 32.00 | 26.84 | 2312.44 |
| 140 | 100 | 47.66 | 25.4 | 0.879 | 2.15 | 413.43 | 32.27 | 26.82 | 2494.62 |

For the 2" pipe, a length of 4 m is roughly equivalent to 30 seconds in the paddle mixer (see Table 5). For the 2" pipe tests in the laboratory scale rig, it was observed that the MFT was oversheared at the pipe exit, which was about 16 m from the polymer injection location. If the initial mixing is disregarded, the shear experience of the treated MFT at the exit of the pipe would be roughly equivalent to 140 seconds in the paddle mixer, based on the required pipe length to produce the same Camp Number. Again, based on laboratory paddle mixing tests, this amount of mixing has been shown to correspond to an oversheared case, which was indeed observed in the pipe test rig experiments.

TABLE 5

Treated MFT parameters for STP 22% SBW MFT in a 2" pipe at 30 LPM.

| Mixing Time, t s | Mixer Speed N RPM | Static Yield Stress Pa | $\tau_2$ Pa | n | k kg s$^{n-2}$/m | Camp No. | Shear Rate, G s$^{-2}$ | Pipe Length m | Pressure Gradient, dP/dx Pa/m |
|---|---|---|---|---|---|---|---|---|---|
| 20 | 320 | 165.80 | 39.3 | 1.0 | 0.040 | 975.10 | 20.62 | 11.66 | 3697.52 |
| 50 | 100 | 88.58 | 30.3 | 1.0 | 0.121 | 381.85 | 21.41 | 4.40 | 3301.99 |
| 80 | 100 | 68.76 | 26.7 | 1.0 | 0.140 | 384.44 | 21.64 | 4.38 | 3050.79 |
| 110 | 100 | 53.37 | 22.1 | 1.0 | 0.153 | 388.09 | 21.90 | 4.37 | 2674.87 |
| 140 | 100 | 40.00 | 19.4 | 1.0 | 0.149 | 390.18 | 22.01 | 4.37 | 2408.43 |
| 170 | 100 | 33.80 | 16.3 | 1.0 | 0.165 | 394.75 | 22.30 | 4.37 | 2171.42 |

Correlation Model:

In order to utilize the paddle mixer data for pipe flow predictions, the following procedure may be implemented:
1. For a particular thick fine tailings type and polymer flocculant dosage, measure the rheology flow curves for various mixing times of the typical paddle mixer experiments, as presented in Tables 2 and 3 (e.g., build up a data base of Herschel-Bulkley coefficients and correlate the data with optimal water release characteristics).
2. Determine the Camp Number for the various mixing times from CFD of the paddle mixer (e.g., characterize the mixer shear rate without having to do a CFD run at each different set of Herschel-Bulkley coefficients).
3. Determine the equivalent pipe length $L_{eq}$ from a pipe shear rate estimate using a particular set of Herschel-Bulkley coefficients (from a point in the paddle mixing curve that is after the peak yield stress).
4. Split the discharge pipe of length L into n=L/$L_{eq}$ segments so that each segment is roughly equivalent to the mixing time increments of the paddle mixer curve.
5. Calculate the $\Delta P$ for each segment $L_{eq}$ by applying the appropriate Herschel-Bulkley coefficients for that segment.

An alternative to Steps 4 and 5 is to determine what pipe length is required for the particular MFT-polymer flocculant mixture to obtain optimum water release without overshearing (i.e., instead of calculating the pressure drop along a given length). With correct Camp Number scaling, there will be an optimum pipe length for a particular MFT, regardless of flow rate, if there is sufficient initial mixing at the polymer flocculant injection location.

In order to make the pipe flow predictions outlined in the above procedure, expressions for the pressure drop and average shear rate for the laminar flow of a Herschel-Bulkley fluid can be used. The following expressions for the velocity profile have been derived in the literature:

For $0 < r < r_y$
$$U = U_c.$$

For $r_y < r < R$
$$U = U_c\left(1 - \left(\frac{r - r_y}{R - r_y}\right)^{\frac{n+1}{n}}\right). \tag{11}$$

The center-line velocity $U_c$ is given by:

$$U_c = \left(-\frac{1}{2k}\frac{dP}{dx}\right)^{\frac{1}{n}}\left(\frac{n}{n+1}\right)(R - r_y)^{\frac{n+1}{n}} \tag{12}$$

and the mean velocity $U_m$ is:

$$U_m = U_c\left(1 - \frac{2n}{R^2}\frac{(R - r_y)^2}{(3n+1)} - \frac{2n}{R^2}\frac{(R - r_y)}{(2n+1)}r_y\right). \tag{13}$$

The yield radius $r_y$ is obtained from a force balance on the central core:

$$r_y = \frac{2\tau_y}{\frac{dP}{dx}}. \tag{14}$$

Now, the literature gives the following equation for the pressure gradient:

$$\frac{dP}{dx} = \frac{4k}{D}\left(\frac{8U}{C}\right)^n\left(\frac{3n+1}{4n}\right)^n\left(\frac{1}{1-X}\right)\left(\frac{1}{1-aX-bX^2-cX^3}\right)^n \tag{15}$$

where X is given by $$X = \frac{\tau_y}{\tau_w} = \frac{4\tau_y}{DdP/dx} \tag{16}$$

and $$a = \frac{1}{2n+1};\ b = \frac{2n}{(n+1)(2n+1)};\ c = \frac{2n^2}{(n+1)(2n+1)}. \tag{17}$$

Finally, the average shear rate G can be calculated by integrating the velocity gradient $\partial U/\partial r$ across the sheared region:

$$G = -\frac{1}{A}\int_{r_s}^{R}\frac{\partial U}{\partial r}2\pi r\, dr \tag{18}$$

where A is either the entire pipe cross-sectional area or just the cross-sectional area of the sheared region, i.e.:

$$A = \pi R^2\ \text{or}\ A = \pi(R^2 - r_y^2) \tag{19}$$

the only difference is whether the shear rate is averaged over the whole pipe or just the sheared area. Regardless, from Eq. (11):

$$\frac{\partial U}{\partial r} = \frac{n \div 1}{n} \frac{-U_c}{(R-r_y)^{\frac{n+1}{n}}} (r-r_y)^{\frac{1}{n}} \quad (20)$$

and Eq. (18) becomes:

$$G = \left(-\frac{1}{2k}\frac{dP}{dx}\right)^{\frac{1}{n}} \frac{2\pi}{A} \int_{r_y}^{R} r(r-r_y)^{\frac{1}{n}} dr \quad (18a)$$

which, upon integration, becomes:

$$G = \left(-\frac{1}{2k}\frac{dP}{dx}\right)^{\frac{1}{n}} \frac{2\pi}{A} (r-r_y)^{\frac{1+n}{n}} \left(\frac{r-r_y}{2+\frac{1}{n}} + \frac{r_y}{1+\frac{1}{n}}\right)\Bigg|_{r_y}^{R} \quad (18b)$$

or $$G = \left(-\frac{1}{2k}\frac{dP}{dx}\right)^{\frac{1}{n}} \frac{2\pi}{A} (R-r_y)^{\frac{1+n}{n}} \left(\frac{R-r_y}{2+\frac{1}{n}} + \frac{r_y}{1+\frac{1}{n}}\right). \quad (18c)$$

With these analytical expressions, the pipe flow predictions outlined in Steps 1 to 5 above can be carried out in a piece-wise fashion along the discharge pipe using the rheology measurements obtained with the paddle mixer at various mixing times.

Net Water Release and Flocculant Dosage:

It should also be noted that the water release zone and the flocculant dosage may be determined according to various methods. In some scenarios, the Net Water Release (NWR) may be measured for the sample flocculated tailings.

NWR is a metric that has been developed and is a measure of the differential in water between the starting thick fine tailings and the treated and drained thick fine tailings after a given draining time. In other words, NWR is a difference in moisture contents. The draining time may be 24 hours, 12 hours, 20 minutes, or 19 minutes, for example, or another representative time period for drainage in commercial applications. There are two main ways to calculate the NWR by volumetric or solid content difference. Example formula to calculate the NWR are as follows:

$$NWR = \left(\frac{\text{Quantity of water Recovered} - \text{Quantity of Flocculant Water Added}}{\text{Quantity of initial Fine Tailings Water}}\right)$$

$$NWR = 1 - \left(\frac{1}{tMFT \text{ wt \% mineral} + \text{wt \% Bitumen} - 1}\right) \div \left(\frac{1}{MFT \text{ wt \% mineral} + \text{wt \% Bitumen} - 1}\right)$$

A NWR test may be conducted using immediate drainage of a flocculation tailings sample for a drainage time of about 20 minutes. In this regard, for optimal dosage range and good flocculation, the water release in 10 or 20 minutes may be about 80% of the water release that would occur over a 12 to 24 hour period. For underdosed or overdosed samples, the water release in 20 minutes may be about 20% to 60% of the water release that would occur over a 12 to 24 hour period. The 20 minute NWR test may therefore be followed by a longer NWR test, e.g. 12 hour drainage time, which may use a water volume or solids content measurement approach. It is also noted that the laboratory and filed tests described herein used a volumetric 24 hour NWR test. A greater initial water release results in a shorter drying duration that is required to achieve a certain solids target. The NWR is dependent on several factors, including the dispersion of the flocculant into the thick fine tailings and the subsequent conditioning (including mixing) of the flocculation tailings. Rapid and thorough dispersion is preferred for increasing NWR.

Another test method includes determining optimal flocculant dosage ranges for flocculating and dewatering the thick fine tailings. In general, the flocculant dosage testing may include determining an amount of the flocculating agent required to transformed a sample of the thick fine tailings into a sample flocculation tailings having a positive measured Net Water Release (NWR) in response to shear conditioning beyond a peak static yield stress. In particular, the dosage testing may include a dose find test (Phase I) and a dose sweep test (Phase II). The Phase I test may include incremental addition of an amount of flocculant to the sample of thick fine tailings until flocculation and water release are observed. For example, 1 to 5 ml of flocculant solution may be incrementally added to the thick fine tailings sample. The sample is subjected to mixing during the flocculant addition, which may be constant rotations per minute of an impeller mixer blade. Each increment of flocculant is well mixed into the sample before adding the next amount of flocculant. Incremental addition may be viewed as a titration to determine an approximate dosage of flocculant for flocculating the given sample and achieving a water release zone. The incremental addition is repeated until a change in the structure of the sample and water release is observed. The water release may be measured by various means, including one of the NWR tests described herein and/or a Capillary Suction Time (CST) test. The Phase II test may be conducted where the flocculant for a given approximate dosage (e.g. determined in Phase I or previously estimated from data sets) is injected all at once. The flocculant may be added to a thick fine tailings sample and then the sample may be subjected to mixing, which may be a two stage mixing of rapid shear mixing to induce dispersion of the flocculant into the sample followed by a slower mixing to shear condition the flocculation sample until it reaches the water release zone. NWR may be determined for each dosage of the sweep. For example, dosages 100 PPM either side of the approximate dosage from Phase I may be determined to produce a dosage curve for each sample (e.g., NWR vs dosage). Additional dosages beyond those may also be tested to provide a more complete curve. The Phase II dose results may be a reasonable indicator of the dosage requirements in up-scaled commercial application of flocculation and dewatering operations. Thus, the flocculant dosage test may include conducting a first dosage test (e.g., Phase I) to identify an initial dosage approximation at which positive NWR occurs and a second dosage sweep test (e.g., Phase II) to determine variation of NWR as a function of dosage of flocculating agent around the initial dosage approximation. The next step may include determining a revised dosage in accordance with a maximum NWR range or value from the dose sweep test. The dosage giving the maximum NWR value may also be extrapolated from the dosage sweep curve if it appears that the maximum dosage would be between two adjacent doses that were actually tested. The revised dosage can then be used for implementing and/or adjusting a flocculation and dewatering operation. Optionally, as illustrated in FIG. 8, the dosage test (e.g., Phase I) and the dosage sweep test (e.g., Phase II), may be followed by full characterization tests (e.g., Phase III) and/or a standard drying test (e.g., Phase IV). The full characterization tests (e.g., Phase III) allow the determination of the water release, YS, viscosity and/or CST in different mixing zones. A single injection may be used. The standard drying test (e.g., Phase IV) allows the determination of the effect of dose and water release on drying rates and rheology.

It should be noted that various implementations, aspects and embodiments described herein may be combined with other implementations, aspects and embodiments described herein.

The invention claimed is:

1. A method of treating thick fine tailings, comprising:
   in a flocculant dispersion stage, dispersing a flocculant into the thick fine tailings under turbulent flow conditions to form a flocculating mixture;
   in a floc buildup stage, shearing the flocculating mixture to increase a yield stress of the flocculating mixture, build up flocs and reach a peak yield stress, thereby producing a flocculated mixture;
   in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and
   in a dewatering stage, dewatering the conditioned flocculated material while within the water release zone; and
   wherein the floc breakdown stage is performed in a pipeline assembly that is dimensioned based on the pre-determined shearing parameter to obtain the laminar flow conditions and reach the water release zone.

2. The method of claim 1, wherein the pre-determined shearing parameter comprises a Camp Number.

3. The process of claim 1, wherein the pre-determined shearing parameter is determined using a test kit comprising:
   a vessel for receiving a sample mixture comprising a sample of the thick fine tailings and the flocculant;
   a mixing element for mixing the sample mixture within the vessel;
   a yield stress measurement device for measuring yield stress of the sample mixture during the mixing;
   a timer for measuring the time during the mixing;
   a shear rate measurement device for measuring the shear rate of the mixing; and
   water release detector for determining when the sample mixture achieves the water release zone where water separates from the sample mixture.

4. The method of claim 1, wherein the step of dewatering comprises depositing the conditioned flocculated material onto a sub-aerial deposition area.

5. The method of claim 1, wherein the step of dewatering comprises supplying the conditioned flocculated material into a separation apparatus to separate the release water from a water-reduced tailings material.

6. The method of claim 1, further comprising a step of empirically deriving the pre-determined shearing parameter.

7. The method of claim 1, wherein the pre-determined shearing parameter comprises shear rate and residence time variables.

8. The method of claim 1, wherein the shear conditioning of the flocculated mixture is performed up until a discharge point at which the flocculated mixture is expelled in order to undergo the dewatering.

9. The method of claim 8, wherein the pre-determined shearing parameter is a Camp Number.

10. The method of any one of claims 9, wherein the shear conditioning is provided by a pipeline assembly.

11. The method of claim 10, wherein the pipeline assembly is provided with a length and a diameter sufficient to impart the shear conditioning to the flocculated mixture in accordance with the pre-determined shearing parameter.

12. The method of claim 1, wherein the shear conditioning of the flocculated mixture is performed exclusively in a pipeline prior to dewatering, and the dewatering comprises depositing the depositing the conditioned flocculated material onto a sub-aerial deposition area.

13. The method of claim 1, wherein the pre-determined shearing parameter comprises a pre-determined Camp Number that has been determined in laboratory tests, and the shear conditioning is implemented in a pipeline assembly such that the Camp Number is substantially similar.

14. The method of claim 5, wherein the pre-determined shearing parameter comprises a dimensionless number.

15. The method of claim 6, wherein the step of empirically deriving the pre-determined shearing parameter comprises:
   determining rheological behaviour of a sample flocculation mixture comprising a sample of the thick fine tailings and the flocculant in a laboratory scale mixer, wherein the sample flocculation mixture increases in yield stress to form a sample flocculated mixture and then decreases in yield stress under shearing conditions;
   determining a laboratory scale shearing parameter sufficient to bring the sample flocculated mixture within a water release zone in the laboratory scale mixer; and
   determining the pre-determined shearing parameter so as to be substantially similar to the laboratory scale shearing parameter.

16. The method of claim 15, wherein the pre-determined shearing parameter consists of shear rate and residence time variables.

17. The method of claim 15, wherein the step of empirically deriving the pre-determined shearing parameter comprises laboratory experimentation.

18. The method of claim 17, further comprising determining an equivalent pipe length and diameter for a pipeline assembly based on the pre-determined shearing parameter in order to provide the shear conditioning.

19. The method of claim 17, wherein the laboratory scale mixer comprising a paddle mixer.

20. The method of claim 15, wherein the step of determining rheological behaviour of the sample flocculation mixture, comprises:
   determining an optimal flocculant dose range for addition to the sample of the thick fine tailings;
   adding the flocculant into the sample of the thick fine tailings sample at the optimal flocculant dose range, to form a sample flocculating mixture;
   imparting dispersive mixing to the sample flocculating mixture in order to promote dispersion of the flocculant and floc build up, to form the sample flocculated mixture;
   imparting lower mixing to the sample flocculated mixture in order to commence floc breakdown until reaching the water release zone; and determining a yield stress response over time of the flocculating mixture and the flocculated material and wherein the shear conditioning of the flocculated mixture is performed under laminar flow conditions.

21. The method of claim 20, wherein the pre-determined shearing parameter consists of a Camp Number.

22. The method of claim 21, wherein the shear conditioning of the flocculated mixture is performed up until a discharge point at which the flocculated mixture is expelled in order to undergo the dewatering.

23. The method of any one of claims 21, wherein the shear conditioning is provided by a pipeline assembly.

24. A method of treating thick fine tailings, comprising:
in a flocculant dispersion stage, dispersing a flocculant into the thick fine tailings under turbulent flow conditions to form a flocculating mixture;
in a floc buildup stage, shearing the flocculating mixture to increase a yield stress of the flocculating mixture, build up flocs and reach a peak yield stress, thereby producing a flocculated mixture;
in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and
in a dewatering stage, dewatering the conditioned flocculated material while within the water release zone;
wherein the shear conditioning is provided by a pipeline assembly dimensioned to transport the flocculated mixture under laminar flow conditions based on the pre-determined shearing parameter, the pre-determined shearing parameter being a Camp Number determined by Camp Number scaling from laboratory scale mixer tests.

25. The method of claim 24, wherein the Camp Number scaling comprises:
determining rheological behaviour of a sample flocculation mixture comprising a sample of the thick fine tailings and the flocculant in the laboratory scale mixer;
determining a laboratory scale Camp Number sufficient to bring the sample flocculation mixture within a water release zone in the laboratory scale mixer;
determining the Camp Number so as to be substantially similar to the laboratory scale Camp Number; and
determining an equivalent pipe length for the pipeline assembly based on the Camp Number.

26. A method of treating thick fine tailings, comprising:
in a flocculant dispersion stage, dispersing a flocculant into the thick fine tailings under turbulent flow conditions to form a flocculating mixture;
in a floc buildup stage, shearing the flocculating mixture to increase a yield stress of the flocculating mixture, build up flocs and reach a peak yield stress, thereby producing a flocculated mixture;
in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and
in a dewatering stage, dewatering the conditioned flocculated material while within the water release zone;
wherein the shear conditioning of the flocculated mixture is provided exclusively by a pipeline assembly prior to dewatering, and the pipeline assembly being dimensioned to transport the flocculated mixture under laminar flow conditions based on the pre-determined shearing parameter.

27. A method of treating thick fine tailings, comprising:
in a flocculant dispersion stage, dispersing a flocculant into the thick fine tailings under turbulent flow conditions to form a flocculating mixture;
in a floc buildup stage, shearing the flocculating mixture to increase a yield stress of the flocculating mixture, build up flocs and reach a peak yield stress, thereby producing a flocculated mixture;
in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and
in a dewatering stage, dewatering the conditioned flocculated material while within the water release zone;
wherein the shear conditioning of the flocculated mixture is provided by a pipeline assembly comprising at least one bifurcation into branch lines, and the pipeline assembly being dimensioned to transport the flocculated mixture under laminar flow conditions based on the pre-determined shearing parameter.

28. A method of treating thick fine tailings, comprising:
in a flocculant dispersion stage, dispersing a flocculant into the thick fine tailings under turbulent flow conditions to form a flocculating mixture;
in a floc buildup stage, shearing the flocculating mixture to increase a yield stress of the flocculating mixture, build up flocs and reach a peak yield stress, thereby producing a flocculated mixture;
in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and
in a dewatering stage, dewatering the conditioned flocculated material while within the water release zone;
wherein the shear conditioning of the flocculated mixture is provided by a pipeline assembly comprising an in-line mixer having an equivalent pipe length value, and the pipeline assembly being dimensioned to transport the flocculated mixture under laminar flow conditions based on the pre-determined shearing parameter.

29. A method of treating thick fine tailings, comprising:
in a flocculant dispersion stage, dispersing a flocculant into the thick fine tailings under turbulent flow conditions to form a flocculating mixture;
in a floc buildup stage, shearing the flocculating mixture to increase a yield stress of the flocculating mixture, build up flocs and reach a peak yield stress, thereby producing a flocculating mixture;

in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and in a dewatering stage, dewatering the conditioned flocculated material while within the water release zone;

wherein the method further comprises:

modifying properties of the thick fine tailings, type of flocculant; and/or dosage of the flocculant with respect to the thick fine tailings;

determining a new shearing parameter and a new amount of shear conditioning for the flocculated mixture; and imparting the new shear conditioning to the flocculated mixture sufficient that the flocculated mixture is within the water release zone; and wherein the shear conditioning of the flocculated mixture is provided by a pipeline assembly dimensioned to transport the flocculated mixture performed under laminar flow conditions based on the pre-determined shearing parameter.

30. A method of treating thick fine tailings, comprising:

in a flocculant dispersion stage, dispersing a flocculant into the thick fine tailings under turbulent flow conditions to form a flocculating mixture;

in a floc buildup stage, shearing the flocculating mixture to increase a yield stress of the flocculating mixture, build up flocs and reach a peak yield stress, thereby producing a flocculated mixture;

in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and in a dewatering stage, dewatering the conditioned flocculated material while within the water release zone;

wherein the shear conditioning of the flocculated mixture is provided by a pipeline assembly dimensioned to transport the flocculated mixture under laminar flow conditions based on the pre-determined shearing parameter, and the pre-determined shearing parameter and a pre-determined amount of the shear conditioning are provided so as to achieve a water release peak range within the water release zone.

31. A method of treating thick fine tailings, comprising:

in a flocculant dispersion stage, dispersing a flocculant into the thick fine tailings under turbulent flow conditions to form a flocculating mixture;

in a floc buildup stage, shearing the flocculating mixture to increase a yield stress of the flocculating mixture, build up flocs and reach a peak yield stress, thereby producing a flocculated mixture;

in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and in a dewatering stage, dewatering the conditioned flocculated material while within the water release zone;

wherein the thick fine tailings comprise mature fine tailings derived at least in part from a tailings pond; and wherein the shear conditioning of the flocculated mixture is provided by a pipeline assembly dimensioned to transport the flocculated mixture under laminar flow conditions based on the pre-determined shearing parameter.

32. A method of treating thick fine tailings, comprising:

in a flocculant dispersion stage, dispersing a flocculant into the thick fine tailings under turbulent flow conditions to form a flocculating mixture;

in a floc buildup stage, shearing the flocculating mixture to increase a yield stress of the flocculating mixture, build up flocs and reach a peak yield stress, thereby producing a flocculated mixture;

in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and in a dewatering stage, dewatering the conditioned flocculated material while within the water release zone;

wherein the shear conditioning of the flocculated mixture is provided by a pipeline assembly dimensioned to transport the flocculated mixture under laminar flow conditions based on the pre-determined shearing parameter; and wherein the method further comprises:

shearing a sample of flocculated thick fine tailings material and determining a sample shearing parameter comprising residence time and shear rate sufficient to bring the sample within a water release zone where release water separates from the sample; and to impart the shear conditioning, configuring the pipeline assembly so as to have a pipe length and diameter providing a pipeline shearing parameter that is substantially similar to the sample shearing parameter.

33. A method of treating thick fine tailings, comprising:

in a flocculant dispersion stage, dispersing a flocculant into the thick fine tailings under turbulent flow conditions to form a flocculating mixture;

in a floc buildup stage, shearing the flocculating mixture to increase a yield stress of the flocculating mixture, build up flocs and reach a peak yield stress, thereby producing a flocculated mixture;

in a floc breakdown stage, shear conditioning the flocculated mixture under laminar flow conditions in accordance with a pre-determined shearing parameter to decrease the yield stress of the flocculated mixture and break down flocs, the pre-determined shearing parameter being sufficient to produce a conditioned flocculated material that is within a water release zone wherein release water separates from the conditioned flocculated material; and in a dewatering stage, dewatering the conditioned flocculated material while within the water release zone;

wherein the shear conditioning of the flocculated mixture is provided by a pipeline assembly dimensioned to transport the flocculated mixture under laminar flow conditions based on the pre-determined shearing parameter, the pipeline assembly having a pipe length and diameter sized and configured according to a pipeline shearing parameter that is substantially similar to a pre-determined sample shearing parameter comprising residence time and shear rate sufficient to bring a sample of the flocculated thick fine tailings material within a water release zone where release water separates from the sample.

34. The method of claim 33, further comprising:
shearing multiple samples of the flocculated thick fine tailings material and determining multiple corresponding sample shearing parameters sufficient to bring the sample within a water release zone where release water separates from the sample; and
configuring the pipeline assembly to provide multiple line sections having different lengths and/or diameters for imparting corresponding pipeline shearing parameters that are substantially similar to the respective sample shearing parameters.

* * * * *